United States Patent
Ji et al.

(10) Patent No.: US 12,283,534 B2
(45) Date of Patent: Apr. 22, 2025

(54) POWER SEMICONDUCTOR DEVICES WITH IMPROVED OVERCOAT ADHESION AND/OR PROTECTION

(71) Applicant: Wolfspeed, Inc., Durham, NC (US)

(72) Inventors: In Hwan Ji, Durham, NC (US); Jae-Hyung Park, Apex, NC (US); Philipp Steinmann, Durham, NC (US)

(73) Assignee: Wolfspeed, Inc., Durham, NC (US)

( * ) Notice: Subject to any disclaimer, the term of this patent is extended or adjusted under 35 U.S.C. 154(b) by 709 days.

(21) Appl. No.: 17/088,647

(22) Filed: Nov. 4, 2020

(65) Prior Publication Data

US 2022/0139793 A1    May 5, 2022

(51) Int. Cl.
*H01L 23/31*    (2006.01)
*H01L 23/00*    (2006.01)

(52) U.S. Cl.
CPC ........ *H01L 23/3142* (2013.01); *H01L 23/562* (2013.01)

(58) Field of Classification Search
None
See application file for complete search history.

(56) References Cited

U.S. PATENT DOCUMENTS

| | | | | |
|---|---|---|---|---|
| 6,198,166 B1 * | 3/2001 | Coronati | ................ | H01L 23/10 257/730 |
| 2005/0082611 A1 * | 4/2005 | Peake | ................ | H01L 29/7811 257/341 |
| 2007/0196956 A1 * | 8/2007 | Imoto | ................ | H01L 23/3178 257/E23.125 |
| 2010/0007028 A1 * | 1/2010 | Fachmann | .......... | H01L 23/3135 430/311 |
| 2010/0181688 A1 * | 7/2010 | Yanagisawa | ........ | H01L 23/3107 257/E23.116 |
| 2012/0199991 A1 * | 8/2012 | Okamoto | ............ | H01L 23/3142 257/E23.117 |

* cited by examiner

*Primary Examiner* — Bo B Jang
(74) *Attorney, Agent, or Firm* — Myers Bigel, P.A.

(57) ABSTRACT

A power semiconductor device includes a semiconductor layer structure and a protective overcoating on a bonding surface of the semiconductor layer structure. The bonding surface includes a plurality of adhesion features along an interface with the protective overcoating. The adhesion features protrude from and/or are recessed in the bonding surface, and define an adhesion strength between the bonding surface and the protective overcoating that spatially varies along the interface. Related devices and fabrication methods are also discussed.

32 Claims, 13 Drawing Sheets

POWER SEMICONDUCTOR DEVICES WITH IMPROVED OVERCOAT ADHESION AND/OR PROTECTION

FIELD

The present disclosure is directed to semiconductor devices, and more particularly, to protection of power semiconductor devices.

BACKGROUND

Power semiconductor devices are used to carry large currents and support high voltages. A wide variety of power semiconductor devices are known in the art including, for example, power Metal Insulator Semiconductor Field Effect Transistors ("MISFETs", including Metal Oxide Semiconductor FETs ("MOSFETs")), bipolar junction transistors ("BJTs"), Insulated Gate Bipolar Transistors ("IGBTs"), Schottky diodes, Junction Barrier Schottky ("JBS") diodes, merged p-n Schottky ("MPS") diodes, Gate Turn-Off Thyristors ("GTOs"), MOS-controlled thyristors and various other devices. These power semiconductor devices are generally fabricated from wide bandgap semiconductor materials such as silicon carbide (SiC) or gallium nitride (GaN) based materials (herein, the term "wide bandgap semiconductor" encompasses any semiconductor having a bandgap of at least 1.4 eV). Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential.

A conventional silicon carbide power device typically has a silicon carbide substrate, such as a silicon carbide wafer, on which an epitaxial layer structure is formed. This epitaxial layer structure (which may include one or more separate layers) functions as a drift layer or drift region of the power semiconductor device. The device typically includes an "active region," which includes one or more "unit cell" structures that have a p-n junction and/or a Schottky junction. The active region may be formed on and/or in the drift region. The active region acts as a main junction for blocking voltage in the reverse bias direction and providing current flow in the forward bias direction.

Power semiconductor devices may have a unit cell configuration in which the active region of each power semiconductor device includes a large number of individual unit cell structures that are electrically connected in parallel to function as a single power semiconductor device. In high power applications, such a power semiconductor device may include thousands or tens of thousands of unit cells implemented in a single chip or "die." A die or chip may include a small block of semiconducting material or other substrate in which electronic circuit elements are fabricated.

Power semiconductor devices can have a lateral structure or a vertical structure. In a device having a lateral structure, the terminals of the device (e.g., the drain, gate and source terminals for a power MOSFET) are on the same major surface (i.e., upper or lower) of a semiconductor layer structure. In contrast, in a device having a vertical structure, at least one terminal is provided on each major surface of the semiconductor layer structure (e.g., in a vertical MOSFET, the source and gate may be on the upper surface of the semiconductor layer structure and the drain may be on the bottom surface of the semiconductor layer structure). For example, power Schottky diodes typically have a vertical structure where the anode contact is formed on a first major surface (e.g., the top surface) of a semiconductor layer structure, and the cathode contact is formed on the other major surface (e.g., the bottom surface). Vertical structures are typically used in very high power applications, as the vertical structure allows for a thick semiconductor drift layer that can support high current densities and block high voltages. The semiconductor layer structure may or may not include an underlying substrate. Herein, the term "semiconductor layer structure" refers to a structure that includes one or more layers such as semiconductor substrates and/or semiconductor epitaxial layers.

A relatively thick protective overcoating layer, e.g. a polyimide layer, is often used in power semiconductor device chips for electrical and/or chemical protection (e.g., arcing, moisture, etc.) of the semiconductor layer structure. Thermomechanical stress, which may originate from differences or mismatch in the coefficients of thermal expansion (CTE) of the semiconductor layer structure and the overcoating layer, can be significant in larger power semiconductor device chips, potentially leading to cracking and/or delamination of the overcoating layer. Delamination may occur if the overcoating layer material integrity is more robust than the adhesion strength. Cracking may occur if the overcoating layer material integrity is weaker than the integrity at which delamination may occur.

SUMMARY

According to some embodiments, a power semiconductor device includes a semiconductor layer structure, and a protective overcoming on a bonding surface of the semiconductor layer structure. The bonding surface comprises a plurality of adhesion features along an interface with the protective overcoating. The adhesion features may protrude from and/or may be recessed in the bonding surface at one or more regions of the interface.

In some embodiments, the adhesion features may define an adhesion strength between the bonding surface and the protective overcoating. The adhesion strength may spatially vary along the interface.

In some embodiments, an area density of the adhesion features at a periphery of the interface may be greater than at a central region of the interface.

In some embodiments, the periphery of the interface may include corner regions and edge regions around the central region. The adhesion features may be arranged at the corner regions, and the central region and/or the edge regions may be free of the adhesion features.

In some embodiments, the bonding surface may be a non-planar patterned surface including microstructures that define the adhesion features.

In some embodiments, the adhesion features may be rounded, rectangular or triangular in cross-section.

In some embodiments, the adhesion features may define inverted frustum shapes having opposing sidewalls that are inclined or curved towards one another at the interface.

In some embodiments, the bonding surface may be an intermediary layer comprising a material that is configured to increase adhesion and/or reduce permeability between the semiconductor layer structure and the protective overcoating. The intermediary layer may include a dielectric, metal, or semiconductor layer. For example, the intermediary layer may be an oxide- or nitride-based passivation layer.

In some embodiments, the power semiconductor device may be a Schottky junction, and the periphery of interface may be an edge termination region of the Schottky junction.

In some embodiments, the power semiconductor device may be a MOSFET, and the periphery of the interface may be a periphery of a metallization or an edge termination region of the MOSFET.

In some embodiments, a submount may be provided, where the submount includes the semiconductor layer structure attached thereto. An overmold may extend on the submount, the bonding surface, and the protective overcoating thereon, and a stress buffer film may be provided between the overmold and the bonding surface adjacent the periphery of the interface. The stress buffer film may be configured to vary adhesion between the overmold and bonding surface.

According to some embodiments, a power semiconductor device includes a semiconductor layer structure, and a protective overcoating on a bonding surface of the semiconductor layer structure. An adhesion strength between the bonding surface of the semiconductor layer structure and the protective overcoating thereon spatially varies along an interface therebetween.

In some embodiments, the adhesion strength at a periphery of the interface may be greater than at a central region of the interface.

In some embodiments, the periphery of the interface may include corner regions and edge regions, and the adhesion strength at the corner regions may be greater than at the edge regions.

In some embodiments, the bonding surface may include a plurality of adhesion features protruding therefrom and/or recessed therein along one or more regions of the interface.

In some embodiments, the bonding surface may be a non-planar patterned surface including microstructures that define the adhesion features.

In some embodiments, the adhesion features may be inverted frustum shapes having opposing sidewalls that are inclined or curved towards one another at the interface.

In some embodiments, the bonding surface may be an intermediary layer comprising a material that is configured to increase adhesion and/or reduce permeability between the semiconductor layer structure and the protective overcoating.

In some embodiments, a submount may be provided including the semiconductor layer structure attached thereto. An overmold may extend on the submount, the bonding surface, and the protective overcoating thereon, and a stress buffer film may extend between the overmold and the bonding surface adjacent the periphery of the interface. The stress buffer film may be configured to vary adhesion between the overmold and bonding surface.

According to some embodiments, a power semiconductor device includes a semiconductor layer structure, and a protective overcoating on a bonding surface of the semiconductor layer structure. An interface between the protective overcoating and the bonding surface comprises a non-planar patterned surface.

In some embodiments, the non-planar patterned surface may include microstructures protruding from and/or recessed in the bonding surface.

In some embodiments, an area density of the microstructures at a periphery of the interface may be greater than at a central region of the interface.

In some embodiments, the periphery of the interface may include corner regions and edge regions around the central region. The microstructures may be arranged at the corner regions, and the central region and/or the edge regions may be free of the microstructures.

According to some embodiments, a power semiconductor device includes a submount; a semiconductor layer structure attached to the submount; a protective overcoating on a bonding surface of the semiconductor layer structure, where an interface between the bonding surface and the protective overcoating thereon is opposite the submount; an overmold extending on the submount, the bonding surface, and the protective overcoating thereon; and a stress buffer film between the overmold and the bonding surface adjacent a periphery of the interface. The stress buffer film is configured to vary adhesion between the overmold and bonding surface.

In some embodiments, the periphery of the interface may include corner regions and edge regions around a central region. The stress buffer film may extend on at least one of the corner regions, and the central region and/or the edge regions may be free of the stress buffer film.

In some embodiments, the stress buffer film may be a silicone coating.

In some embodiments, an adhesion strength between the bonding surface of the semiconductor layer structure and the protective overcoating thereon may spatially vary along the interface therebetween.

In some embodiments, the adhesion strength at the periphery of the interface may be greater than at a central region of the interface.

In some embodiments, the periphery of the interface may include corner regions and edge regions, and the adhesion strength at the corner regions may be greater than at the edge regions.

In some embodiments, the bonding surface may include a plurality of adhesion features protruding therefrom and/or recessed therein along one or more regions of the interface.

In some embodiments, the bonding surface may be an intermediary layer comprising a material that is configured to increase adhesion and/or reduce permeability between the semiconductor layer structure and the protective overcoating.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Figure 11A:
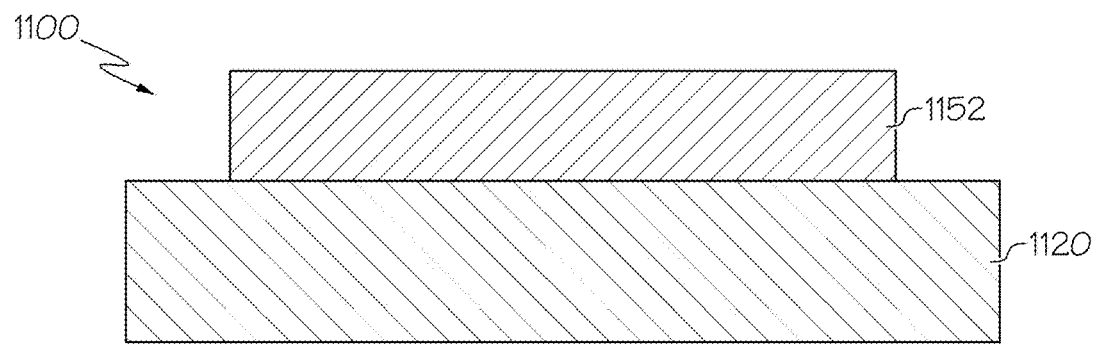
FIG. 11A is a schematic cross-sectional view illustrating a conventional power semiconductor device.

Embodiments of the present disclosure are directed to power semiconductor devices with protective overcoating layers. As shown in FIG. 11A, a power semiconductor device 1100 may include a protective overcoating 1152 on a semiconductor layer structure 1120. The protective overcoating 1152 may be a polymer or other non-conductive layer (e.g., polyimide), which may differ in materials and/or characteristics as compared to the materials of the semiconductor layer structure 1120.

Figure 11B:
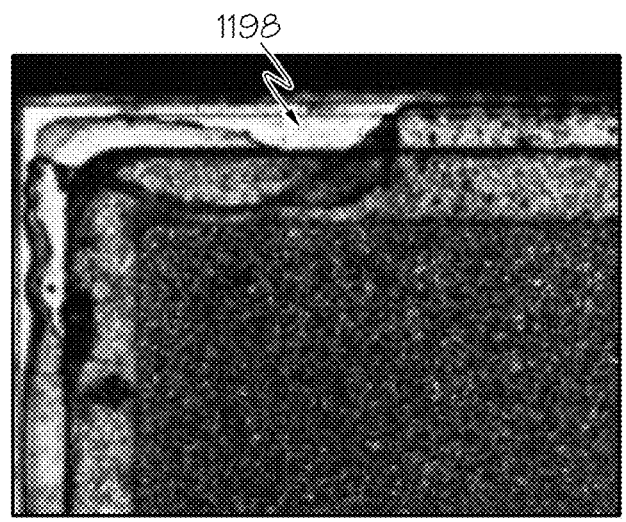
FIGS. 11B and 11C are plan view photographs illustrating examples of delamination of protective overcoating layers in conventional power semiconductor devices.
Figure 11C:
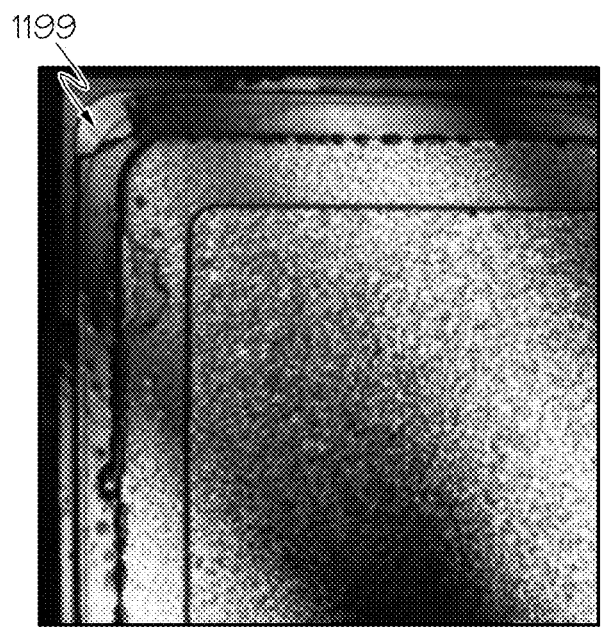

Some power semiconductor devices may be subjected to operating conditions and/or thermal shock testing (e.g., for hundreds of cycles and/or at temperatures ranging from about −65° C. to about 150° C. or more, in some instances up to about 500° C.) that may induce thermomechanical stress in the device 1100. As noted above, thermomechanical stress can lead to cracking and/or delamination of the overcoating 1152. For example, FIG. 11B is a plan view photograph illustrating delamination 1198 of the overcoating 1152 at the edge of the semiconductor layer structure 1120 after repeated cycles of thermal shock. FIG. 11C is a plan view photograph illustrating delamination 1199 of the overcoating 1152 due to the presence of significant shear stress at a corner of the semiconductor layer structure 1120 of the die during thermal shock testing.

Differences or mismatch in the coefficients of thermal expansion (CTE) of the materials of the semiconductor layer structure 1120 and the protective overcoating 1152 can contribute to such different levels of thermomechanical stress. While such stress can be alleviated by selecting material combinations having closer or more compatible CTEs, this may come at a price, such as reduced protection and/or limitations on use of materials that may be otherwise be advantageous (e.g., due to improved electrical/chemical/mechanical performance and/or lower cost).

Figure 12:
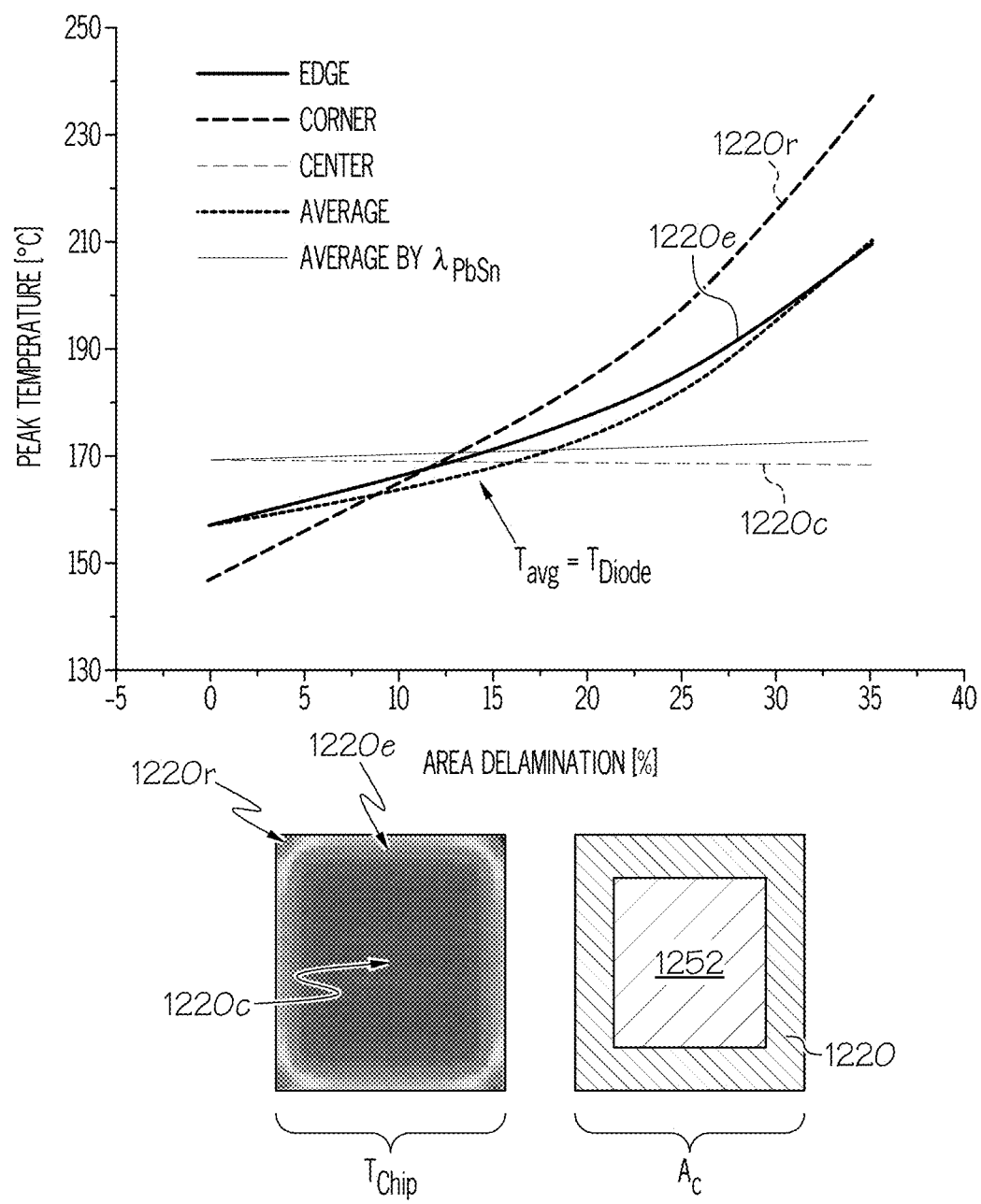
FIG. 12 is a graph illustrating delamination of protective overcoating layers versus peak temperature at edge, corner, and central portions in conventional power semiconductor devices.

FIG. 12 is a graph illustrating delamination versus peak temperature at edge 1220e, corner 1220r, and central 1220c portions of a semiconductor layer structure 1220 including an overcoating 1252 thereon. As shown in FIG. 12, delamination of the overcoating 1252 at central portions 1220c of the semiconductor layer structure 1220 is relatively temperature-independent. However, delamination of the overcoating 1252 at the edge 1220e and corner 1220r portions of the semiconductor layer structure 1220 increases with temperature, with delamination at the corner portions 1220r increasing more significantly as peak temperature increases.

Some embodiments of the present disclosure may arise from realization that the likelihood of delamination of the overcoating material may be reduced or prevented by increasing adhesion strength along the interface between the protective overcoating and the bonding surface of the semiconductor layer structure, particularly at regions where stress may be concentrated. For example, adhesion strength may be increased by increasing the contact surface area along the interface between the protective overcoating and the bonding surface. In some embodiments, structures that enhance adhesion (referred to herein as adhesion features) may protrude from and/or may be recessed into the bonding surface of the semiconductor layer structure, thereby increasing the contact surface area along the interface between the overcoating and the underlying bonding surface. As used herein, a bonding surface of the semiconductor layer structure may refer to any layer that provides an interface with the protective overcoating, for example, a surface of one of the layers of the semiconductor layer structure, or a surface of any layer between the semiconductor layer structure and the overcoating.

In some embodiments, the adhesion strength may spatially vary over the surface area of contact between the overcoating and the underlying bonding surface. For example, the adhesion features may be provided with spatial variation along the interface, e.g., by selectively forming the adhesion features at one or more regions along the interface where stress may be more concentrated. In some embodiments, an area density of the adhesion features (i.e., a number of adhesion features per unit area) and/or a height or depth of the adhesion features may differ in respective regions of the bonding surface to provide the spatially varying adhesion strength. In some embodiments, the adhesion features may be selectively defined or arranged at edges and/or corners of the bonding surface. For example, in Schottky diode implementations, the adhesion features may be provided at edges and/or at corners along a periphery of and/or outside the edge termination region. In MOSFET implementations, the adhesion features may be provided at edges and/or at corners along a periphery of a metallization layer, or along a periphery of and/or outside the edge termination region.

In some embodiments, the adhesion features may be defined by patterning the bonding surface (e.g., using an etch mask) to define microstructures that protrude from or are recessed into the bonding surface (e.g., by about 0.5 microns to about 5 microns, depending on the thickness of the bonding surface) prior to forming the protective overcoating thereon. For example, the adhesion features may define respective rectangular, triangular, pyramidal, conical, rounded, and/or any other suitably shaped protrusions or recesses in the bonding surface. In addition, subsets of the adhesion features may be distributed on the bonding surface to collectively define respective arrangement patterns in plan view. For example, subsets of adhesion features may collectively define circular, rectangular, hexagonal, or octagonal arrangement patterns in plan view.

In some embodiments, the adhesion features may be shaped or otherwise configured to provide cohesion (based on material integrity, including mechanical and/or chemical properties) between the protective overcoating and the bonding surface. For example, the adhesion features may define anchoring structures having inverted frustum shapes (e.g., inverted pyramidal, conical, or spherical segment shapes).

The bonding surface may include one or more layers of the semiconductor layer structure (for example, epitaxial layers defining portions of the drift region) and/or layers formed on the semiconductor layer structure (for example, passivation layers (e.g., silicon nitride (SiN), silicon oxide (SiOx), silicon oxynitride (SiON)) and/or other intermediary layers (e.g., metallic, semiconductor)) to which the overcoating is attached. In some embodiments, the intermediary layer(s) may provide the bonding surface, and the adhesion features may protrude from or may be recessed into the intermediary layer(s), instead of (or in addition to) protruding from or being recessed into the epitaxial layers. The intermediary layers may be configured to provide protection, increase adhesion, and/or reduce permeability to moisture penetration into the semiconductor layer structure.

In some embodiments, the protective overcoating may extend beyond the intermediary layer and onto a portion of the epitaxial layers of the semiconductor layer structure, such that the intermediary layer defines a first bonding surface and the semiconductor layer defines a second bonding surface, and each of the first and second bonding surfaces include respective adhesion features. For example, the intermediary layer may be a silicon nitride or other protective layer including first adhesion features on the edge termination region of a device, and the portions of the semiconductor layer structure may be silicon carbide including second adhesion features outside of the edge termination region. The first adhesion features may protrude from and/or may be recessed into the first bonding surface of the intermediary layer with different heights/depths than the second adhesion features that protrude from and/or are recessed into the second bonding surface of the semiconductor layer structure. For example, the first adhesion features of the intermediary layer may have one or more dimensions that are limited by the thickness of the intermediary layer, while the second adhesion features of the semiconductor layer structure may have one or more dimensions that protrude from and/or are recessed into the semiconductor layer structure beyond the heights/depths of the first adhesion features.

More generally, adhesion features as described herein may be provided in or on one or more different bonding surfaces, with varying amounts of protrusion and/or recession and/or in varying distributions or patterns on the one or more bonding surfaces, and in various areas of the one or more bonding surfaces (e.g., where stress between the protective overcoating and the bonding surface(s) may be more concentrated).

Additionally or alternatively, some embodiments may include a stress buffer film (e.g., a gel coating, for example silicone) on at least a portion of the overcoating and/or the bonding surface, as a stress buffer for thermal shock. In overmold-type power semiconductor device packages (where an overmold compound may completely or partially encapsulate the die on a package submount or flange), the stress buffer film may be selectively provided at portions (e.g., edges and/or corners) of the bonding surface, so as to maintain adhesion between the overmold and the semiconductor layer structure along with the benefits of stress reduction (and the thermal resistance provided thereby).

Figure 1A:
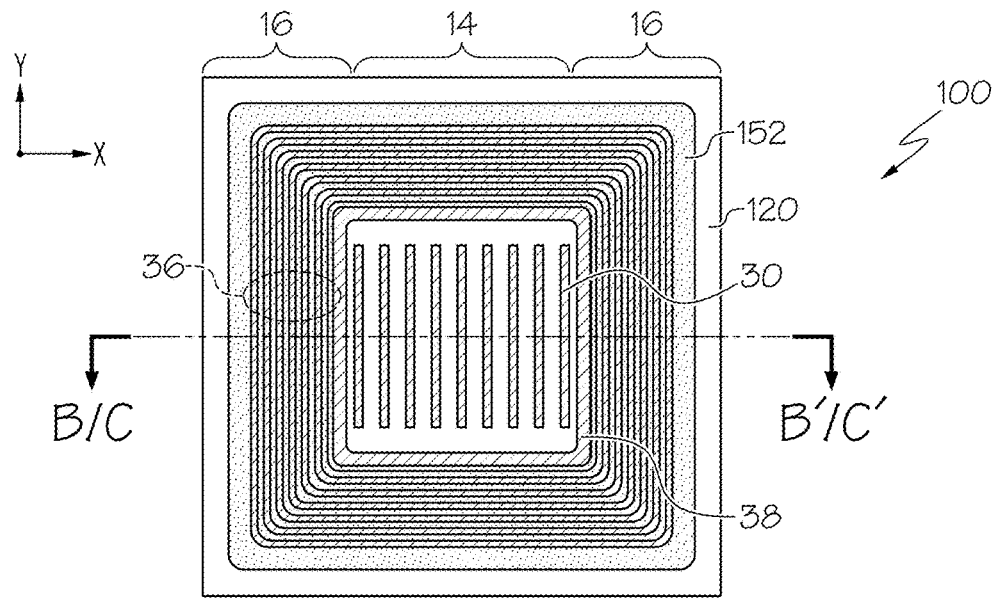
FIG. 1A is a schematic plan view of a Schottky diode that may include adhesion features accordance with some embodiments of the present disclosure.
Figure 1B:
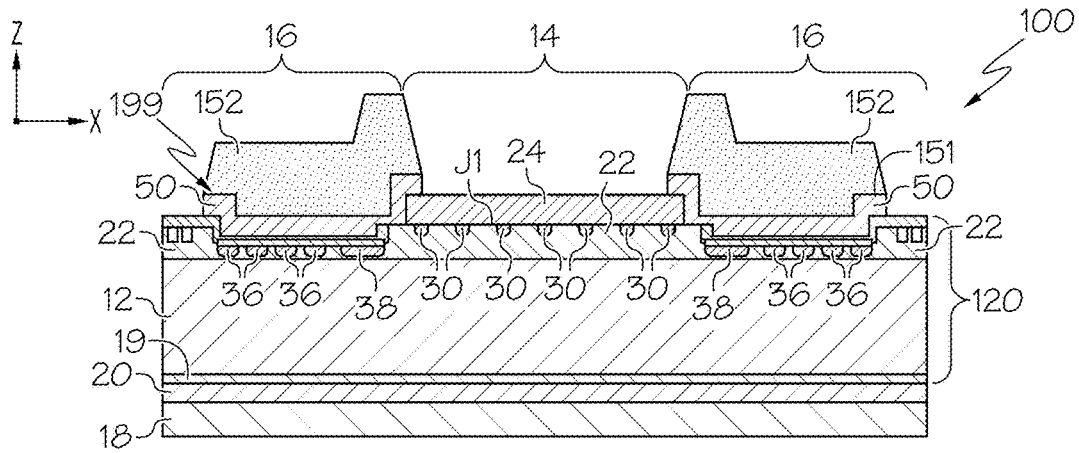
FIGS. 1B and 1C are schematic cross-sectional views taken along line B/C-B'C' of FIG. 1A.

FIG. 1A is a schematic plan view of a power semiconductor device 100 that may include adhesion-enhancing features accordance with some embodiments of the present disclosure. FIG. 1B is a schematic cross-sectional view of the power semiconductor device 100 taken along line B/C-B'/C' of FIG. 1A. In FIGS. 1A and 1B, the power semiconductor device 100 is illustrated as a Schottky diode by way of example. The Schottky diode 100 has a "unit cell" structure in which the active region includes a plurality of individual diodes that are disposed in parallel to each other and that together function as a single power Schottky diode.

Figure 1C:
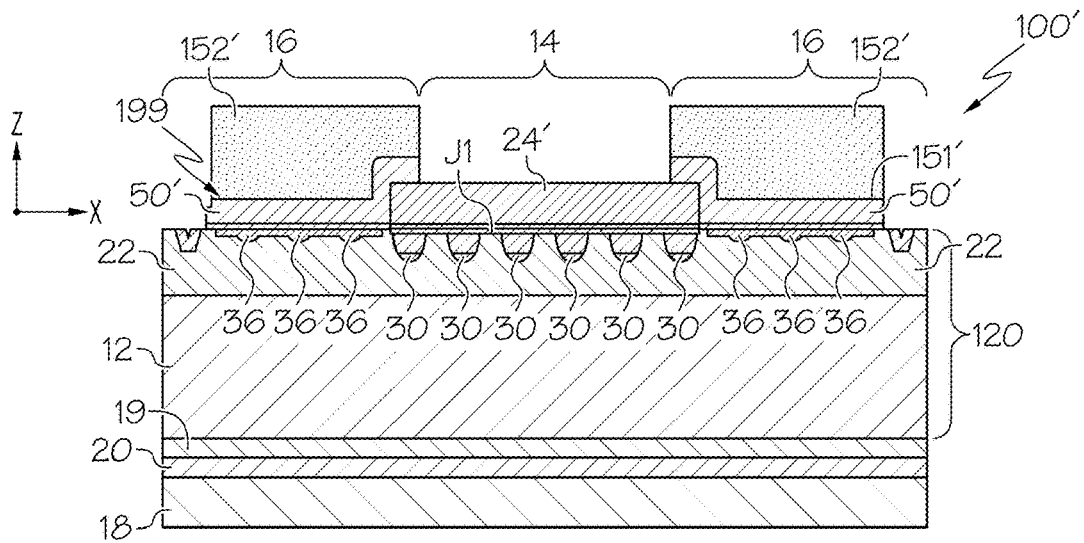

As shown in FIGS. 1A to 1C, the Schottky diode 100 includes a substrate 12 in which an active region 14 within an edge termination region 16 is defined. The edge termination region 16 may help reduce undesired electric field crowding effects that may occur at the edges of the active region 14. The edge termination region 16 may, but does necessarily, completely or substantially surround the active region 14. A drift layer 22 extends along the top side of the substrate 12 to define a semiconductor layer structure 120. The substrate 12 may be a wide band-gap semiconductor substrate. In the example Schottky diode 100, the substrate 12 and the drift layer 22 are silicon carbide (SiC)-based, for example, a SiC substrate 12 and a SiC drift layer 22 epitaxially grown thereon with a uniform or graded doping concentration. One or more buffer layers (not shown) may be used as a nucleation layer on the substrate 12 prior to forming the drift layer 22. The substrate 12 may have various crystalline polytypes, such as 2H, 4H, 6H, 3C and the like. The substrate 12 and the drift layer 22 are not limited to SiC, and may be formed from other material systems, such as, for example, Group III nitrides (e.g., GaN), gallium arsenide (GaAs), silicon (Si), germanium (Ge), silicon germanium (SiGe), and the like.

A cathode contact 18 extends along the bottom of the substrate 12 below both the active region 14 and the edge termination region 16. The cathode contact may be formed of titanium (Ti), nickel (Ni), and/or silver (Ag) in some embodiments. One or more cathode ohmic layers 19, 20 may be provided between the substrate 12 and the cathode contact 18 to facilitate a low impedance coupling therebetween. The cathode ohmic layer(s) may include one or more layers of ohmic metal, such as a nickel (Ni) layer 20 and a nickel silicide (NiSi) layer 19. While not shown, one or more additional layers may be formed on the cathode contact 18 to define a backside metal stack for attachment to a package submount. The backside metal stack may include, but is not limited to, multi-layer metal stacks including titanium (Ti), titanium tungsten (TiW), gold (Au), platinum (Pt), nickel (Ni), and/or aluminum (Al). The drift layer 22 and the cathode contact 18 may extend along both the active region 14 and the edge termination region 16 on opposite sides of the substrate 12.

In the active region 14, a Schottky metal layer 24 is provided on the top surface of the drift layer 22 to define a metal-semiconductor junction J1, which provides a Schottky barrier and is created between the metal layer 24 and the doped semiconductor drift layer 22. The Schottky metal layer 24 may be formed of titanium (Ti), tantalum (Ta), and/or aluminum (Al) in some embodiments. The Schottky diode 100 may function as a traditional p-n diode by passing current in the forward-biased direction and blocking current in the reverse-biased direction; however, the Schottky barrier provided at the metal-semiconductor junction J1 provides advantages including a lower barrier height (which correlates to lower forward voltage drops and a smaller forward turn-on voltage), and lower capacitance (which can allow for higher switching speeds).

An anode contact (not shown) may be formed on the Schottky layer 24. In the illustrated embodiment, the substrate 12 is heavily doped and the drift layer 22 is relatively lightly doped, e.g., with an N-type or P-type material. The drift layer 22 may be substantially uniformly doped or doped in a graded fashion, e.g., from being relatively more heavily doped proximate the substrate 12 to being more lightly doped proximate the Schottky layer 24.

Beneath the Schottky layer 24, a plurality of junction-barrier (JB) elements 30 are provided along the top surface of the drift layer 22. For example, the JB elements 30 may be formed by selectively doping respective regions in the drift layer 22 (illustrated by way of example as elongated stripes 30 in FIG. 1A) with a doping material of an opposite conductivity type than the drift layer 22. Regions of metal-semiconductor contact between JB elements 30 (that is, any metal-semiconductor junction between the Schottky layer 24 and portions of the top surface of the drift layer 22 that do not have a JB element 30) may be referred to as Schottky junctions J1, while p-n junctions between a JB element 30 and the drift layer 22 may be referred to as a JB junctions. When the Schottky diode 100 is reverse-biased, depletion regions that form adjacent the JB elements 30 expand to block reverse current through the Schottky diode 100, thereby protecting the Schottky junction and limiting reverse leakage current.

As noted, FIG. 1B is a schematic cross-sectional view of the power semiconductor device 100 taken along line B/C-B'C' of FIG. 1A. In FIG. 1B, the edge termination region 16 is recessed relative to the top surface of the drift layer 22 and substantially surrounds a mesa defining the active region 14. The edge termination region 16 includes a plurality of concentric guard rings 36. The guard rings 36 may be formed by heavily doping the corresponding portions of the recessed portions of the drift layer 22 with a doping material of an opposite conductivity type than the drift layer 22. As shown in FIG. 1B, in some embodiments, the edge termination region 16 may include a wider mesa guard ring 38 between the guard rings 36 and the outer periphery of the active region 14. While illustrated as substantially rectangular, the edge termination region 16, the guard rings 36, and the mesa guard ring 38 may be of any shape and will generally correspond to the shape of the periphery of the active region 14, which is rectangular in the illustrated embodiments. Each of these elements may continuously or discontinuously extend around the active region 14. Also, it will be understood that edge termination structures other than guard rings 36 may be used.

FIG. 1C is a schematic cross-sectional view taken along line B/C-B'C' of FIG. 1A illustrating an alternative power semiconductor device 100' that may include adhesion-enhancing features accordance with some embodiments of the present disclosure. The example power semiconductor device 100' is likewise illustrated as a Schottky diode, and may include layers and/or elements similar to the semiconductor device 100 of FIG. 1B unless otherwise noted. In FIG. 1C, the edge termination region 16 is substantially coplanar with the top surface of the drift layer 22.

As shown in FIGS. 1B and 1C, one or more encapsulant layers 50, 50' (e.g., a passivation layer) may be formed on the edge termination region 16 and may extend on edges of the Schottky layer 24. The encapsulant layer(s) 50, 50' may be nitride-based, such as silicon nitride (SiN), and may function as a conformal coating that protects the underlying layers from adverse environmental conditions. In the examples of FIGS. 1A to 1C, the encapsulant layer(s) 50, 50' define portions of a bonding surface of the semiconductor layer structure 120. For further protection against damage (e.g. arcing, moisture, etc.), a protective overcoating (e.g., a polyimide layer) 152, 152' is provided on the bonding surface 50, 50'.

Figure 2A:
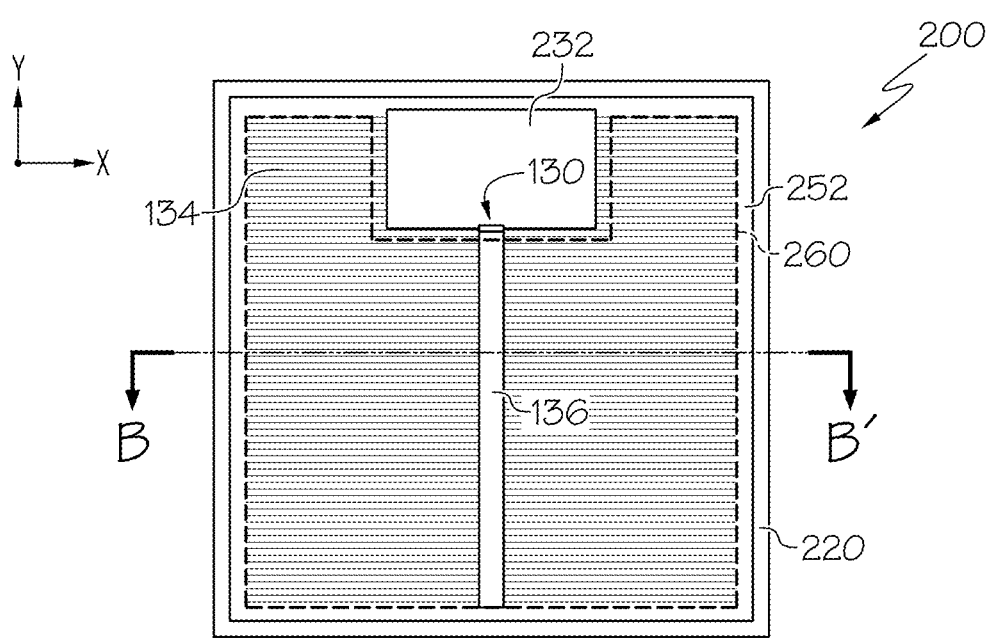
FIG. 2A is a schematic plan view of a MOSFET that may include adhesion features accordance with some embodiments of the present disclosure.
Figure 2B:
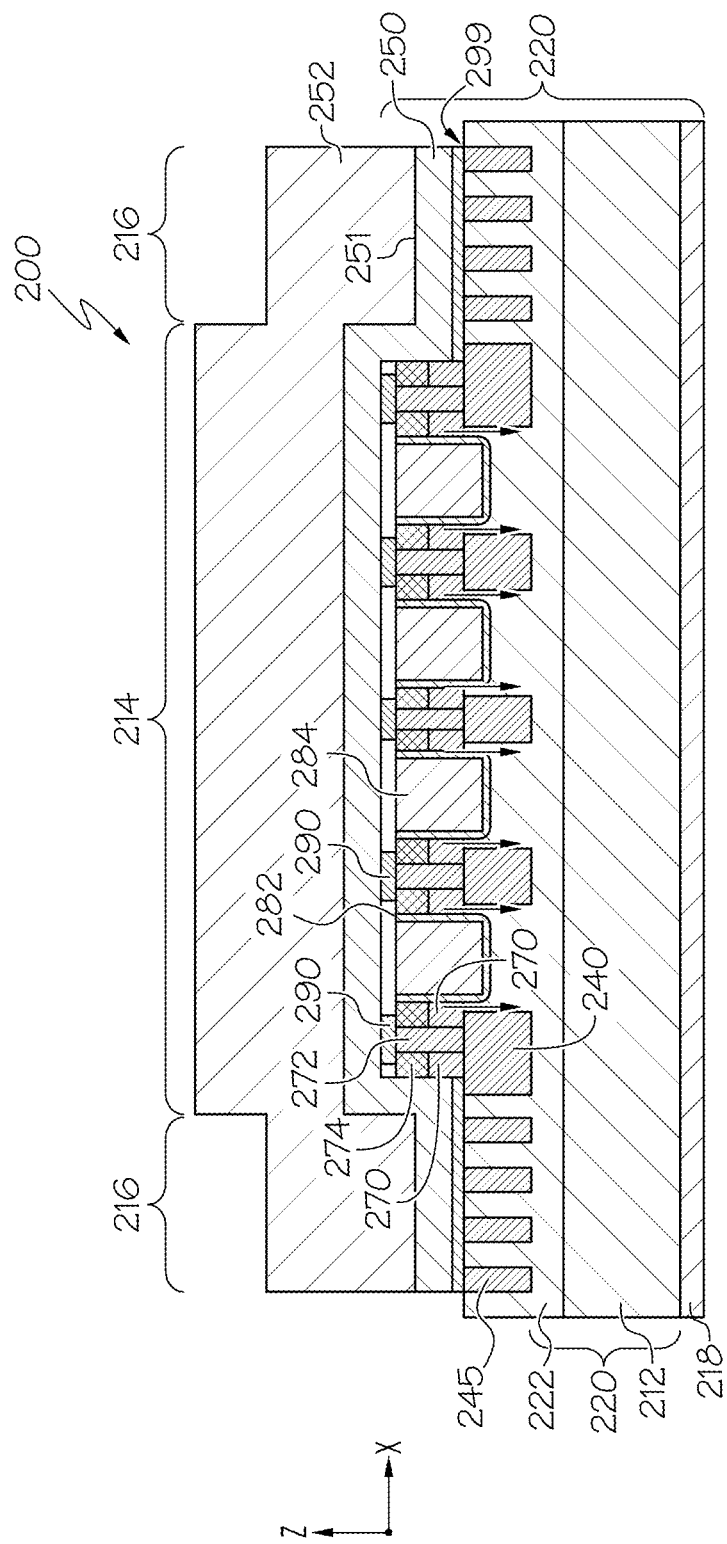
FIG. 2B is a schematic cross-sectional view taken along line B-B' of FIG. 2A.

FIG. 2A is a schematic plan view of a power semiconductor device 200 that may include adhesion-enhancing features accordance with some embodiments of the present disclosure. FIG. 2B is a schematic cross-sectional view of the power semiconductor device 200 taken along line B-B' of FIG. 2A. It will be appreciated that specific layer structures, doping concentrations, materials, conductivity types and the like that are shown in FIGS. 2A-2B and/or described below are merely provided as examples for purposes of illustration rather than limitation.

In FIGS. 2A and 2B, the power semiconductor device 200 is illustrated as a MOSFET by way of example. The MOSFET 200 has a "unit cell" structure in which the active region includes a plurality of individual MOSFETs that are disposed in parallel to each other and that together function as a single power MOSFET. The power MOSFET 200 includes a substrate 212 in which an active region 214 within an edge termination region 216 is defined. The edge termination region 216 may help reduce undesired electric field crowding effects that may occur at the edges of the active region 214. The edge termination region 216 may, but does necessarily, completely or substantially surround the active region 214. A drift layer 222 extends along the top side of the substrate 212 to define a semiconductor layer structure 220.

The substrate 212 may be a wide band-gap semiconductor substrate. In the example power MOSFET 200, the substrate 212 and the drift layer 222 are silicon carbide (SiC)-based, for example, a SiC substrate 212 and a SiC drift layer 222 epitaxially grown thereon with a uniform or graded doping concentration. One or more buffer layers (not shown) may be used as a nucleation layer on the substrate 212 prior to forming the drift layer 22. The substrate 212 may have various crystalline polytypes, such as 2H, 4H, 6H, 3C and the like. The substrate 212 and the drift layer 222 are not limited to SiC, and may be formed from other material systems, such as, for example, Group III nitrides (e.g., GaN), gallium arsenide (GaAs), silicon (Si), germanium (Ge), silicon germanium (SiGe), and the like.

The drift layer 222 may be substantially uniformly doped or doped in a graded fashion, e.g., from being relatively more heavily doped (e.g., to define a current spreading layer) proximate the substrate 212 to being more lightly doped opposite the substrate 212. The edge termination region 216 is recessed relative to the top surface of the drift layer 222 and substantially surrounds a mesa defining the active region 214. The edge termination region 216 includes a plurality of guard rings 245. The guard rings 245 may be formed by heavily doping the corresponding portions of the recessed portions of the drift layer 222 with a doping material of an opposite conductivity type than the drift layer 222. However, it will be understood that edge termination structures other than guard rings 245 may be used.

Spaced apart shielding regions 240 may be formed in the upper surface of the drift layer 222 in the active region 214, and gate trenches 280 are formed extending through well regions 270 in the drift layer 222. The gate trenches 280 may have a U-shaped cross-section in some embodiments, as shown in FIG. 2B. A gate insulating layer 282 such as a silicon oxide layer is formed on the bottom surface and sidewalls of each gate trench 280. A gate electrode 284 is formed on the gate insulating layer 282 in the respective gate trenches 280. The gate electrodes 284 may comprise, for example, a semiconductor or a metal material. Heavily-doped silicon carbide source regions 274 may be formed in upper portions of the well regions 270. Source contacts 290 may be formed on the heavily-doped n-type source region 274. The source contacts 290 may be electrically connected (e.g., by a top side metallization 260 shown in FIG. 2A) to form a single source contact.

The drift region 220 and the substrate 212 together act as a common drain region for the power MOSFET 200. A drain contact 218 may be formed on the lower surface of the substrate 212 below both the active region 214 and the edge termination region 216. While not shown, one or more additional layers may be formed on the drain contact 218 to define a backside metal stack for attachment to a package submount. The backside metal stack may include, but is not limited to, multi-layer metal stacks including titanium (Ti), titanium tungsten (TiW), gold (Au), platinum (Pt), nickel (Ni), and/or aluminum (Al).

As shown in FIG. 2A, a gate bond pad 232 may be electrically connected to each gate electrode 284 by a gate electrode pattern 130. The gate electrode pattern 130 includes a plurality of gate fingers 134, and one or more gate buses 136 that electrically connect the gate fingers 134 to the gate bond pad 232. The gate electrode pattern 130 may comprise, for example, a polysilicon pattern in some embodiments, although metal or other conductive patterns could also be used.

Still referring to FIG. 2A, the MOSFET 200 includes a top-side metallization structure 260 that electrically connects source regions in the semiconductor layer structure 220 of the MOSFET 200 to an external device. The top-side metallization structure 260 is indicated by a dashed box in FIG. 2A as significant portions of the top-side metallization structure 260 (including the uppermost epitaxial layer and the source, the gate, and the drain regions) are covered by an encapsulant layer 250 and a protective overcoating layer 252. The encapsulant layer(s) 250 may be nitride-based (e.g., a SiN layer), may function as a conformal coating that protects the underlying layers from adverse environmental conditions, and may define portions of a bonding surface of the semiconductor layer structure 220. A protective over-coating (e.g., a polyimide layer) 252 is provided on the bonding surface 250, for further protection against damage (e.g., arcing, moisture, etc.). The polyimide layer or other protective overcoating 252 may protect the semiconductor layer structure 220 underneath, and may provide a leveling effect for appropriate handling in following manufacturing steps. The source bond pads may be portions of the top-side metallization structure 260 that are exposed through openings in the protective overcoating 252 in some embodiments. Bond wires (not shown) may be used to connect the gate bond pad 232 and the source bond pads to external circuits or the like.

As noted above, differences or mismatch in the coefficients of thermal expansion (CTE) of the materials of the semiconductor layer structure 120, 220 and the protective overcoating 152, 152', 252 can contribute to different levels of thermomechanical stress, which may result in delamination at one or more regions of along the interface 151, 151', 251 between the bonding surface 50, 50', 250 and the protective overcoating 152, 152', 252. In some embodiments of the present disclosure, adhesion at the interface 151, 151', 251 between the protective overcoating 152, 152', 252 and the bonding surface 50, 50', 250 of the semiconductor layer structure 120, 220 is improved by increasing the bonding or contact surface area at the interface 151, 151', 251. For example, the interface 151, 151', 251 may be defined by a non-planar patterned surface or may otherwise be configured with a spatially varying adhesion strength, in order to prevent and/or reduce the likelihood of delamination.

Adhesion between a semiconductor layer structure and a protective overcoating in the above and other power semi-conductor devices can be improved in accordance with embodiments of the present disclosure by increasing the bonding or contact surface area at the interface between the protective overcoating and a bonding surface of the semi-conductor layer structure. In some embodiments, as the expected thermomechanical stress may be more concentrated at or along a periphery 199, 299 (e.g., edges and/or corners) of the interface (also referred to as the die seal region), improvements in adhesion may be implemented by selectively providing adhesion features at one or more regions of the interface, such that the adhesion strength between the bonding surface and the protective overcoating spatially varies along the interface.

Figure 3A:
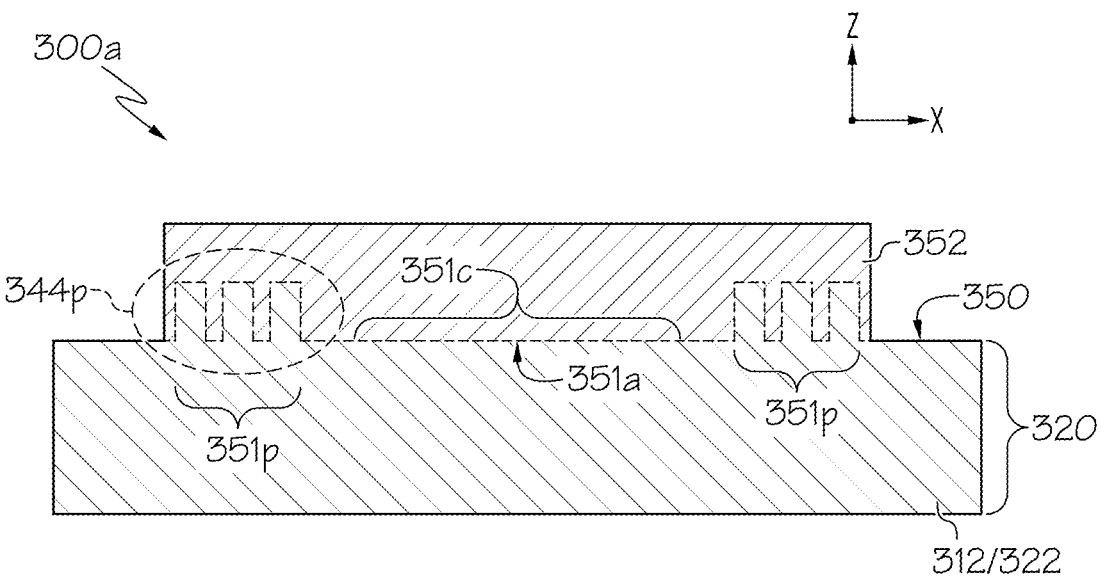
FIGS. 3A and 3B are schematic cross-sectional views illustrating power semiconductor devices including additive and subtractive adhesion features, respectively, according to some embodiments of the present disclosure.
Figure 3B:
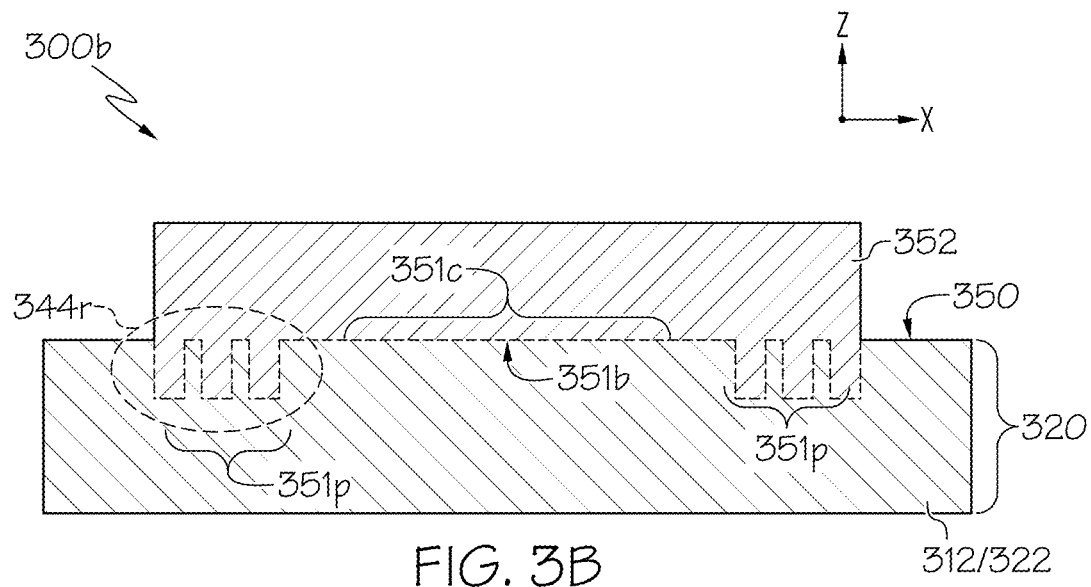

FIGS. 3A and 3B are schematic cross-sectional views illustrating power semiconductor devices including adhesion features according to some embodiments of the present disclosure. As shown in FIGS. 3A and 3B, power semi-conductor devices 300a, 300b each include a semiconductor layer stricture 320 and a protective overcoating 352 on a bonding surface 350 of the semiconductor layer structure 320. The semiconductor layer structure 320 may include a semiconductor substrate 312 and one or more semiconductor layers 322 (such as epitaxial layers defining a drift region and/or passivation layers thereon) on the substrate 312. In some embodiments, the semiconductor layer structure 320 may include substrates and/or layers that are silicon carbide-based or Group III nitride-based (e.g., GaN-based). The protective overcoating 352 may include one or more non-conductive layers, such as polymer layer(s). In some embodiments, the protective overcoating 352 may be a polyimide layer; however, other examples of materials for the protective overcoating 352 include, but are not limited to, polybenzoxazole (PBO) and benzocyclobutene (BCB).

The power semiconductor devices 300a, 300b can include non-planar patterned surfaces or surfaces that are otherwise configured to increase a contact surface area along the interfaces 351a, 351b between the protective overcoating layer 352 and the bonding surface 350 (e.g., as compared to a planar surface area between the protective overcoating 352 and the bonding surface 350). In FIG. 3A, the bonding surface 350 includes adhesion features 344p implemented as additive structures that protrude from one or more regions of the bonding surface 350 along an interface 351a with the protective overcoating 352. In FIG. 3B, the bonding surface 350 includes adhesion features 344r implemented as sub-tractive structures that are recessed in one or more regions of the bonding surface 350 along an interface 351b with the protective overcoating 352. The adhesion features 344p, 344r define respective sidewall surfaces that increase the bonding or contact surface area (and thus, the adhesion strength) along the interfaces 351a, 351b.

As shown in FIGS. 3A and 3B, the adhesion features 344p, 344r are selectively provided at or along peripheral region(s) 351p of the interfaces 351a, 351b. For example, the adhesion features 344p, 344r may be selectively patterned into regions of the bonding surface 350 where stress may be more concentrated. In some embodiments, the adhesion features 344p, 344r may not be provided at or along central regions 351c of the interfaces 351a, 351b; that is, the central regions 351c may be free of the adhesion features 344p, 344r.

The adhesion features described herein may be formed by patterning the bonding surface, for example, by selectively etching the bonding surface using one or more mask patterns. In some embodiments, the adhesion features may be microstructures that protrude from (i.e., to a height of) or are recessed into (i.e., to a depth of) the bonding surface by about 0.5 to 5 microns (for example, by about 1 to 4 microns, or by about 2 to 3 microns). The heights/depths of the adhesion features may depend on or may be limited by the thickness of the layer(s) defining the bonding surface (e.g., the semiconductor layer or intermediary layer thereon). The thickness of the protective overcoating may be greater than the heights/depths of the adhesion features, for example, by about 2 times or more. The adhesion features may have respective widths of about 0.5 to 5 microns (for example widths of about 1 to 4 microns, or of about 2 to 3 microns), and spacings between adjacent features of about 0.5 to 5 microns (for example of about 1 to 4 microns, or of about 2 to 3 microns). The heights/depths and widths or spacings of the adhesion features may be selected to increase the contact surface area between portions of the bonding surface and the protective overcoating thereon, for example, by greater than about 20%, or greater than about 50% or more. In some embodiments, the adhesion features may have heights/depths and spacings or widths in a one-to-one ratio, which may effectively double the contact surface area between the portions of the bonding surface and the protective overcoating.

Figure 4A:
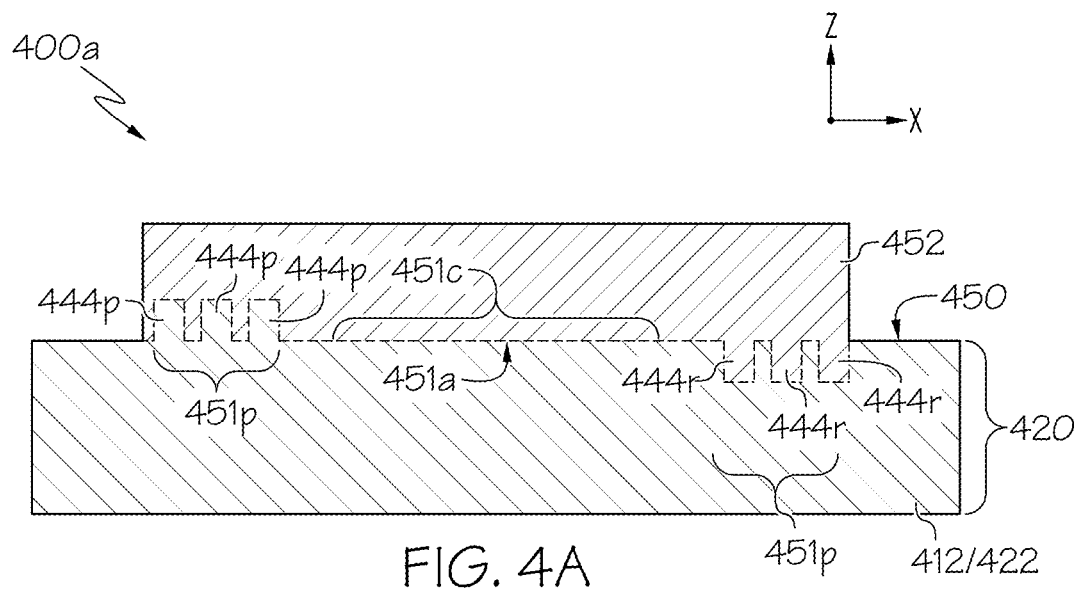
FIGS. 4A and 4B are schematic cross-sectional views illustrating power semiconductor devices including additive and subtractive adhesion features according to some embodiments of the present disclosure.
Figure 4B:
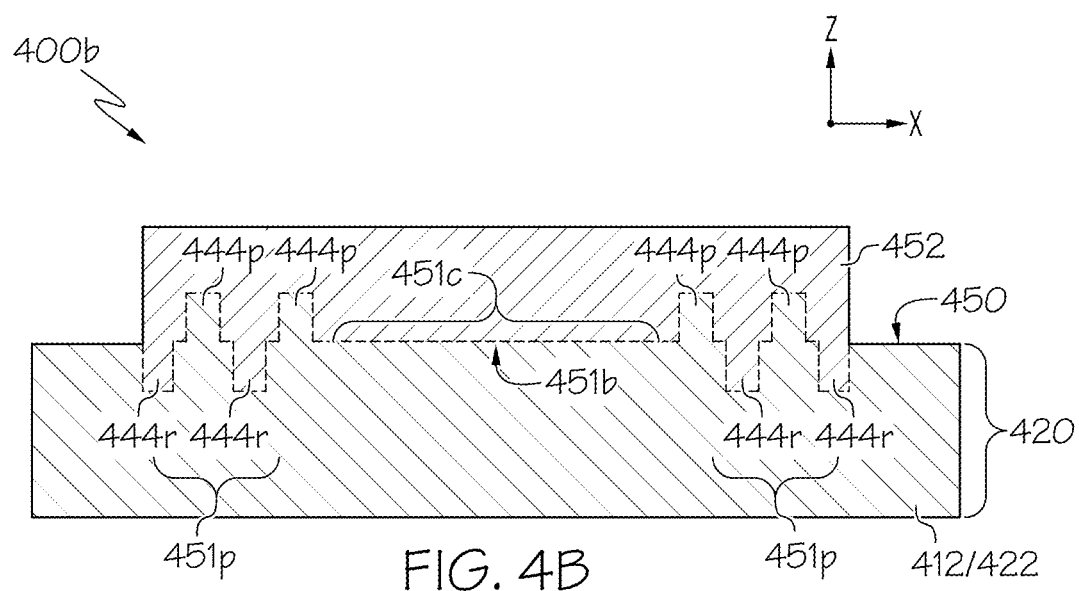

While illustrated in FIGS. 3A and 3B with reference to devices 300a and 300b that include either additive adhesion features 344p or subtractive adhesion features 344r by way of example, it will be understood that combinations of different adhesion features 344p, 344r and/or different arrangements of the features 344p, 344r may be used, as shown by way of example in FIGS. 4A and 4B.

FIGS. 4A and 4B are schematic cross-sectional views illustrating power semiconductor devices including adhesion features according to some embodiments of the present disclosure. As shown in FIGS. 4A and 4B, power semiconductor devices 400a, 400b each include a semiconductor layer structure 420 (which may include a semiconductor substrate 412 and one or more semiconductor layers 422 thereon) and a protective overcoating 452 on a bonding surface 450 of the semiconductor layer stricture 420, one or more of which may be similar to corresponding elements of the devices 300a, 300b described with reference to FIGS. 3A and 3B.

In FIG. 4A, the bonding surface 450 includes adhesion features implemented as both additive structures 444p that protrude from one or more regions of the bonding surface 450 and subtractive structures 444r that are recessed in one or more regions of the bonding surface 450 along an interface 451a with the protective overcoating 452. In FIG. 4B, the bonding surface 450 includes an interspersed arrangement of the additive/protruding adhesion features 444p and the subtractive/recessed adhesion features 444r at one or more regions of an interface 451b with the protective overcoating 452. As in FIGS. 3A and 3B, the adhesion features 444p, 444r are selectively provided at or along peripheral region(s) 451p of the interfaces 451a, 451b (e.g., where stress may be more concentrated), while central regions 451c of the interfaces 451a, 451b may be free of the adhesion features 444p, 444r. The adhesion features 444p, 444r may also be formed by patterning the bonding surface 450 of the semiconductor layer structure 420 to define microstructures that protrude from or are recessed into the bonding surface 450, that is, to provide non-planar patterned surfaces. The adhesion features 444p, 444r likewise define respective sidewall surfaces that increase the bonding or contact surface area (and thus, the adhesion strength) along the interfaces 451a, 451b.

Figure 5A:
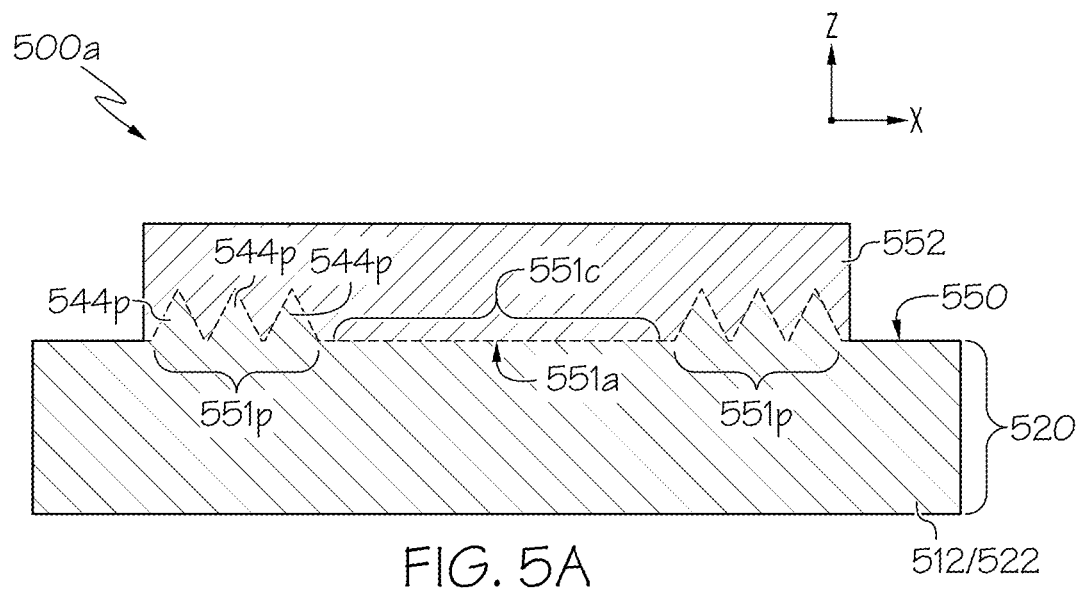
FIGS. 5A and 5B are schematic cross-sectional views illustrating power semiconductor devices including additive and subtractive adhesion features, respectively, according to further embodiments of the present disclosure.
Figure 5B:
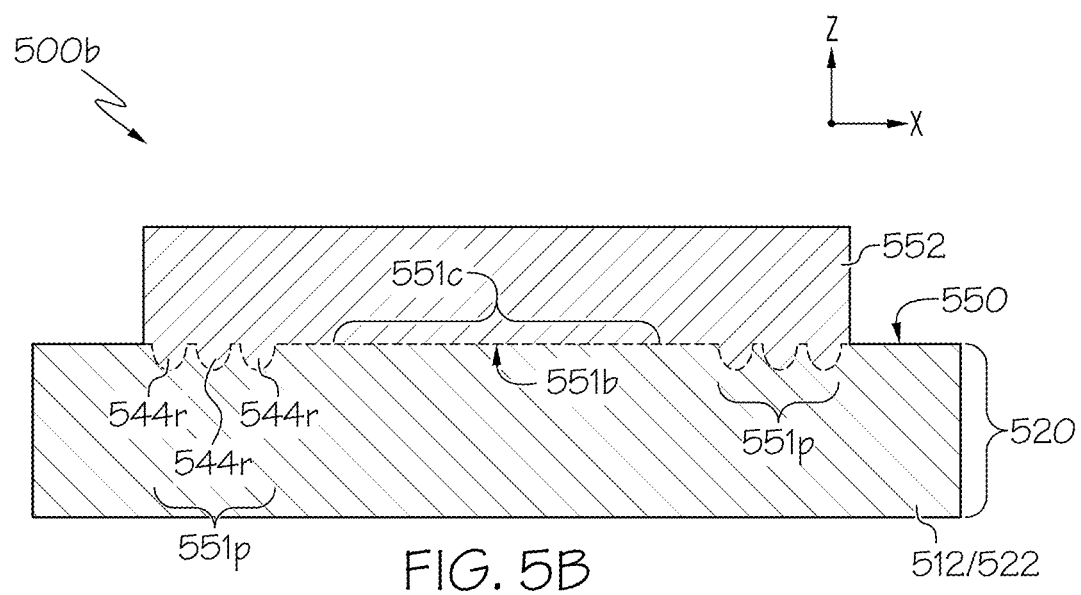

While illustrated in FIGS. 4A and 4B with reference to example devices 400a and 400b that include adhesion features 444p, 444r that are substantially rectangular-shaped in cross-section by way of example, it will be understood that adhesion features of other shapes (e.g., having triangular or rounded shapes in cross-section) may be used, as shown by way of example in FIGS. 5A and 5B.

FIGS. 5A and 5B are schematic cross-sectional views illustrating power semiconductor devices including adhesion features according to some embodiments of the present disclosure. As shown in FIGS. 5A and 5B, power semiconductor devices 500a, 500b each include a semiconductor layer structure 520 (which may include a semiconductor substrate 512 and one or more semiconductor layers 522 thereon) and a protective overcoating 552 on a bonding surface 550 of the semiconductor layer stricture 520, one or more of which may be similar to corresponding elements of the devices 300a, 300b described with reference to FIGS. 3A and 3B.

In FIG. 5A, the bonding surface 550 includes adhesion features 544p implemented as additive structures having triangular cross-sections that protrude from the bonding surface 550 along one or more regions of an interface 551a with the protective overcoating 552. In FIG. 5B, the bonding surface 550 includes adhesion features 544r implemented as subtractive structures having rounded or semi-elliptical cross-sections that are recessed in one or more regions of the bonding surface 550 along an interface 551b with the protective overcoating 552. As in FIGS. 3A and 3B, the adhesion features 544p, 544r are selectively provided at or along peripheral region(s) 551p of the interfaces 551a, 551b (e.g., where stress may be more concentrated), while central regions 551c of the interfaces 551a, 551b may be free of the adhesion features 544p, 544r, and may be similarly formed by patterning the bonding surface 550 of the semiconductor layer structure 520 to define microstructures that protrude from or are recessed into the bonding surface 550, to provide non-planar patterned surfaces. The adhesion features 544p, 544r likewise define respective sidewall surfaces that increase the bonding or contact surface area (and thus, the adhesion strength) along the interfaces 551a, 551b.

While illustrated as including either additive adhesion features 544p or subtractive adhesion features 544r of similar shapes by way of example, it will be understood that adhesion features of different shapes (e.g., 344p, 344r, 444p, 444r, 544p, and/or 544r) and/or different arrangements may be used in any combination in embodiments of the present disclosure. For example, the adhesion features may define substantially rectangular, triangular, pyramidal, conical, and/or rounded protrusions or recesses in the bonding surface.

Figure 6A:
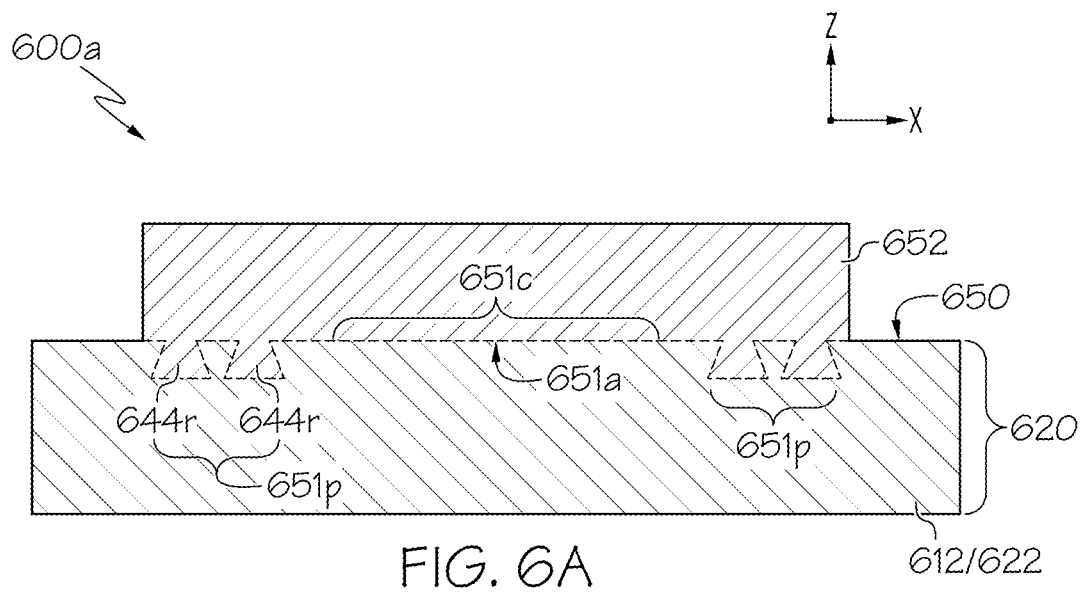
FIGS. 6A and 6B are schematic cross-sectional views illustrating power semiconductor devices including subtractive and additive anchoring adhesion features, respectively, according to some embodiments of the present disclosure.
Figure 6B:
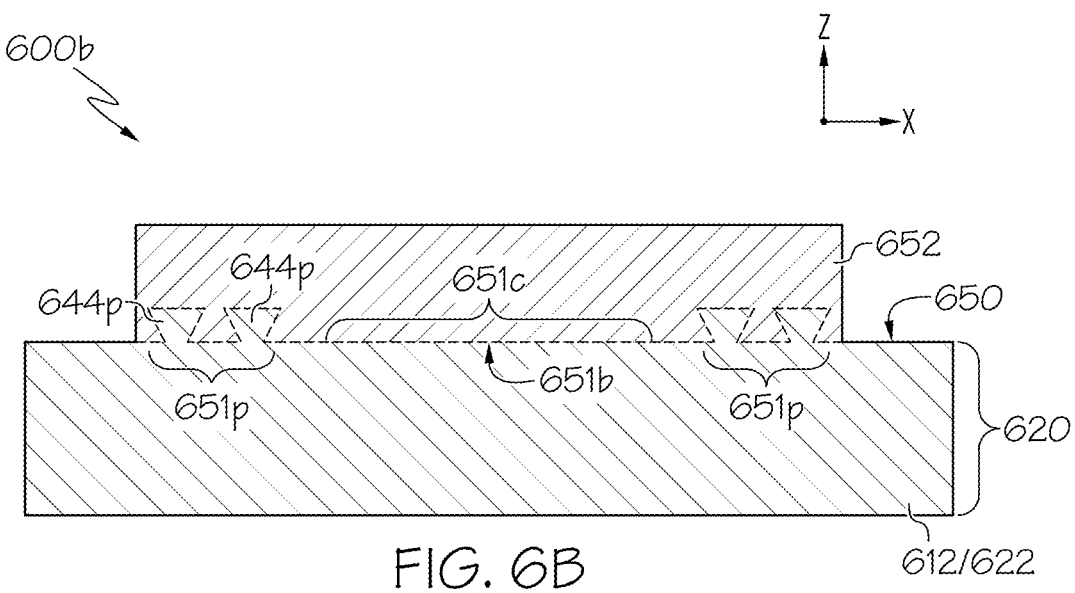

In addition to the illustrated adhesion features defining sidewall surfaces that increase the bonding or contact surface area as shown in FIGS. 3A-3B to 5A-5B, embodiments of the present disclosure can further utilize cohesion (based on the material integrity or internal strength of the material(s) of the bonding surface) to provide adhesion features having anchor-type shapes or configurations that may make delamination mechanically unfavorable, as shown by way of example in FIGS. 6A and 6B.

FIGS. 6A and 6B are schematic cross-sectional views illustrating power semiconductor devices including anchoring adhesion features according to embodiments of the present disclosure. As shown in FIGS. 6A and 6B, power semiconductor devices 600a, 600b each include a semiconductor layer structure 620 (which may include a semiconductor substrate 612 and one or more semiconductor layers 622 thereon) and a protective overcoating 652 on a bonding surface 650 of the semiconductor layer structure 620, one or more of which may be similar to corresponding elements of the devices 300a, 300b described with reference to FIGS. 3A and 3B.

In FIG. 6A, the bonding surface 650 includes anchoring adhesion features 644r implemented as subtractive structures that are recessed in one or more regions of the bonding surface 650 along an interface 651a with the protective overcoating 652. In FIG. 6B, the bonding surface 650 includes anchoring adhesion features 644p implemented as additive structures that protrude from one or more regions of the bonding surface 650 along an interface 651b with the protective overcoating 652. The anchoring adhesion features 644r, 644p include opposing sidewall surfaces that are inclined or curved towards one another at the interfaces 651, 651b. For example, as shown in FIGS. 6A and 6B, the anchoring adhesion features 644r, 644p may have inverted frustum shapes (e.g., inverted pyramidal or conical shapes with inverted triangular segment-shaped cross-sections). In some embodiments, the anchoring adhesion features 644r, 644p may be formed by selectively etching the bonding surface 650 using one or more mask patterns and an isotropic etching process.

The anchoring adhesion features 644r, 644p are not limited to the illustrated inverted frustum shapes, and may include inverted spherical segment shapes (with cross-sections having rounded opposing sidewalls that are curved towards one another at the interface 651a, 651b). As such, the anchoring adhesion features 644p, 644r may not only define respective sidewall surfaces that increase the bonding or contact surface area (and thus, the adhesion strength) along the interfaces 651a, 651b, but may also be shaped or otherwise configured to make delamination mechanically unfavorable, thereby more effectively anchoring the protective overcoating 652 to the semiconductor layer structure 620.

The embodiments of FIGS. 3A-3B to 6A-6B are illustrated primarily with reference to adhesion features that protrude directly from or are recessed directly into a bonding surface of the semiconductor layer structures 320, 420, 520, 620. However, in any of the embodiments described herein, the bonding surface may be provided by one or more intermediary layers between the protective overcoating and the semiconductor layer structure, and the adhesion features may protrude from and/or may be recessed into the intermediary layer(s), as shown by way of example in FIGS. 7A-7C.

Figure 7A:
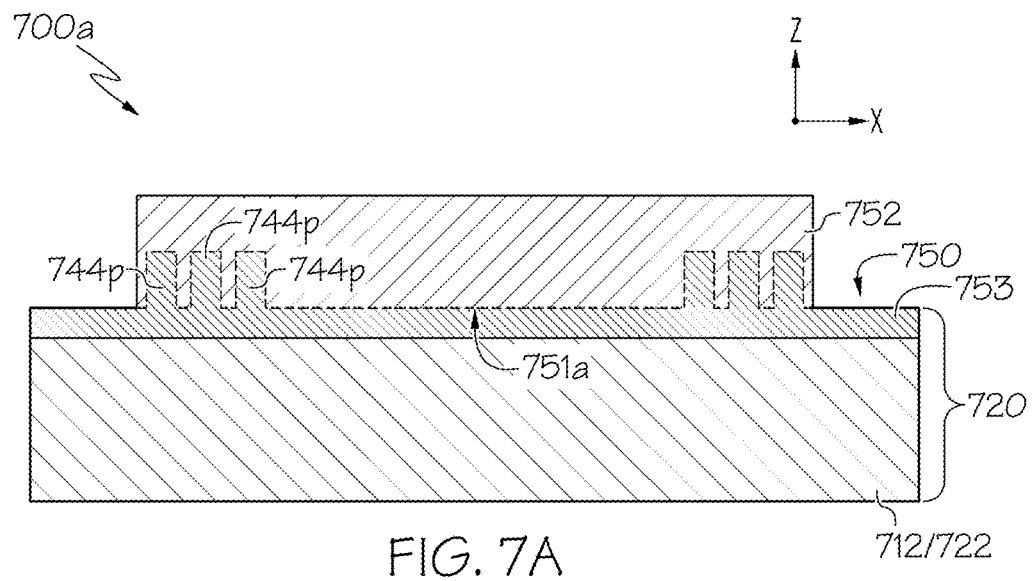
FIGS. 7A, 7B, and 7C are schematic cross-sectional views illustrating power semiconductor devices including intermediary layers with adhesion features according to some embodiments of the present disclosure.
Figure 7B:
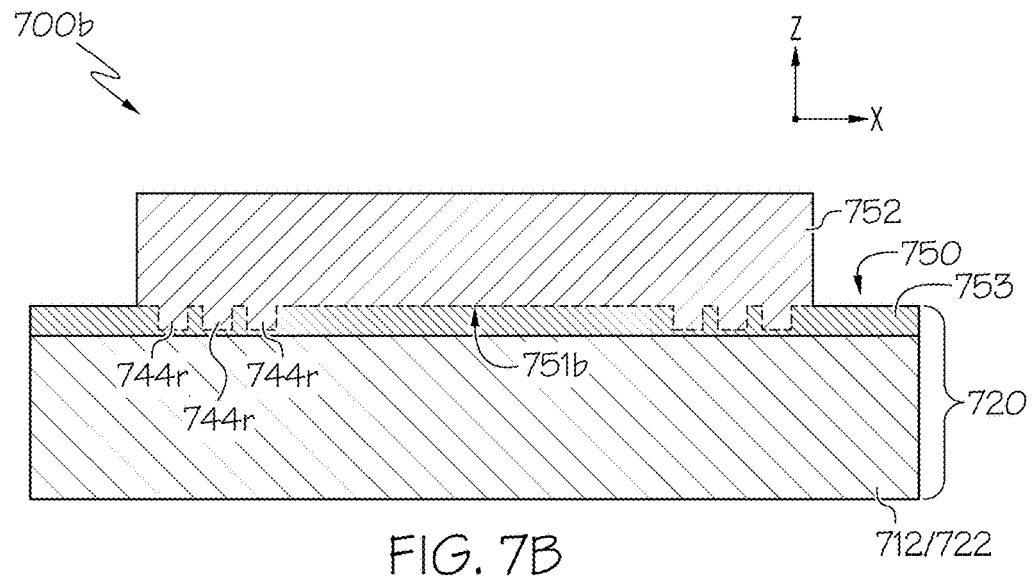
Figure 7C:
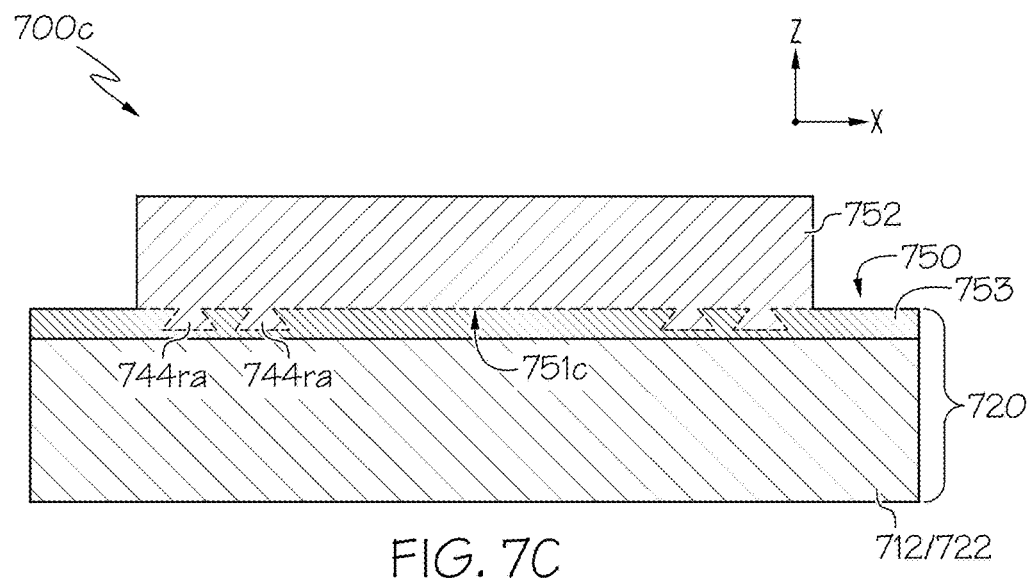

FIGS. 7A, 7B, and 7C are schematic cross-sectional views illustrating power semiconductor devices including intermediary layers with adhesion features according to some embodiments of the present disclosure. As shown in FIGS. 7A, 7B, and 7C, power semiconductor devices 700a, 700b, and 700c include a semiconductor layer structure 720 (which may include a semiconductor substrate 712 and one or more semiconductor layers 722 thereon) and a protective overcoating 752 on a bonding surface 750 of the semiconductor layer structure 720, one or more of which may be similar to corresponding elements of the devices 300a, 300b described with reference to FIGS. 3A and 3B. In FIGS. 7A, 7B, and 7C, the semiconductor layer structure 720 further includes one or more intermediary layer(s) 753, for example, formed on a surface of a drift layer 722 that is epitaxially grown on the substrate 712. The intermediary layer(s) 753 may include one or more materials configured to provide protection for, increase adhesion to, and/or reduce permeability of the surface of the semiconductor layer structure 720. For example, the intermediary layer(s) 753 may include passivation layers, adhesion-enhancing layers, and/or layers configured to increase moisture resistance, including, but not limited to, dielectric, metal, and/or semiconductor layers, at the surface of the drift layer 722. In some embodiments, the intermediary layer(s) may include one or more nitride-based or oxide-based passivation layers, for example, SiN, SiOx, or SiON.

Adhesion features (e.g. one or more of the adhesion features 344p/r, 444p/r, 544p/r, and/or 644p/r) may protrude from or may be recessed into one or more regions of the intermediary layer(s) 753 to define the bonding surface 750. In FIG. 7A, the bonding surface 750 includes adhesion features 744p implemented as additive structures that protrude from the intermediary layer(s) 753 along peripheral regions of an interface 751a with the protective overcoating 752. In FIG. 7B, the bonding surface 750 includes adhesion features 744r implemented as subtractive structures that are recessed in the intermediary layer(s) 753 along peripheral regions of an interface 751b with the protective overcoating 752. In FIG. 7C, the bonding surface 750 includes anchoring adhesion features 744ra that are recessed in the intermediary layer(s) 753 along peripheral regions of an interface 751c with the protective overcoating 752.

It will be understood that the interfaces, adhesion features, and arrangements thereof shown in FIGS. 3A-3B to FIGS. 7A-7C are illustrated by way of example only, and that embodiments of the present disclosure are not limited to these particular examples and may include other shapes, configurations, and/or positions of adhesion features that are configured to provide an adhesion strength that varies along the interface between a semiconductor layer structure and a protective overcoating thereon. More generally, any combination of subtractive, additive, and/or anchoring adhesion features, including variations from those illustrated, may be provided along the interface with the protective overcoating in accordance with embodiments of the present disclosure, in various arrangements as shown by way of example in FIGS. 8A and 8B.

Figure 8A:
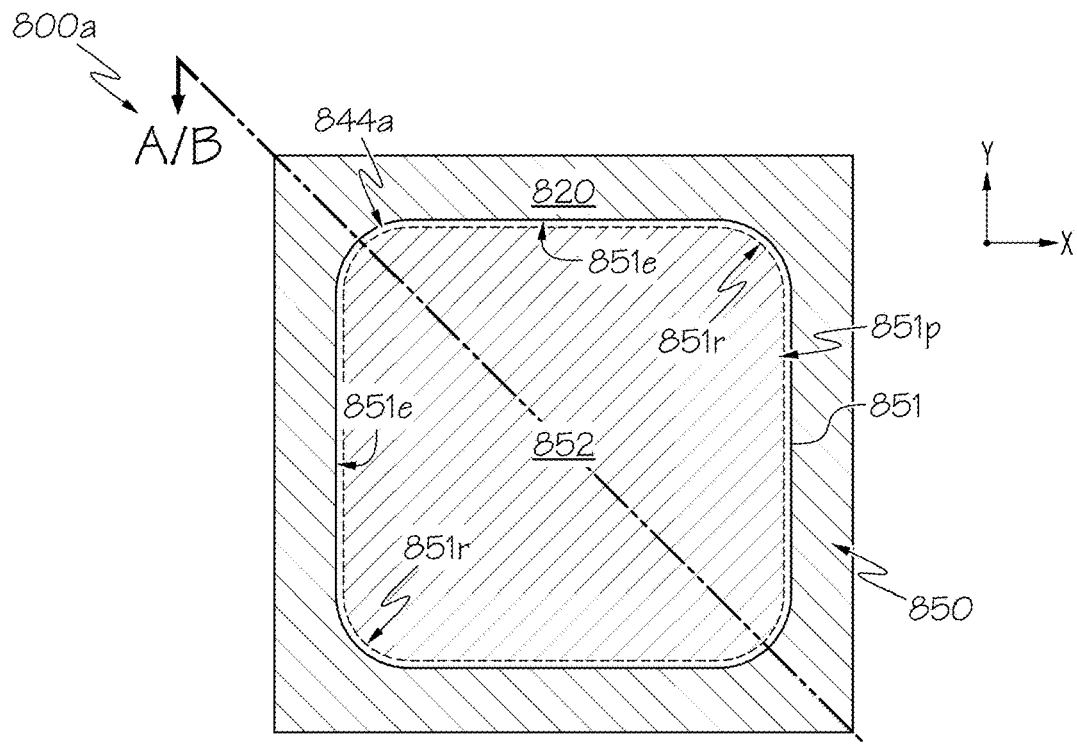
FIGS. 8A and 8B are schematic plan views illustrating power semiconductor devices including adhesion features according to some embodiments of the present disclosure.
Figure 8B:
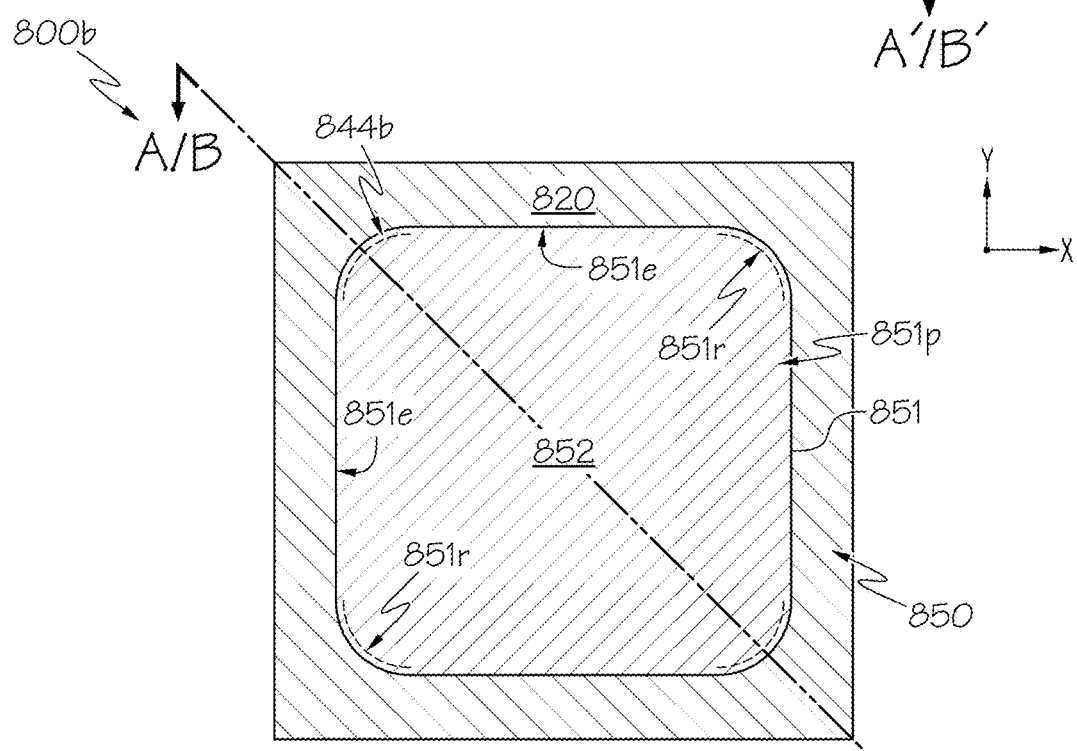

FIGS. 8A and 8B are schematic plan views illustrating example arrangements of adhesion features that are configured to provide an adhesion strength that spatially varies along the interface (e.g., in the x-y plane) between a semiconductor layer structure and a protective overcoating thereon according to some embodiments of the present disclosure. As shown in FIGS. 8A and 8B, power semiconductor devices 800a, 800b include adhesion features 844a, 844b along one or more regions of a periphery 851p of an interface 851 between a semiconductor layer structure 820 (which may include a semiconductor substrate 812 and one or more semiconductor layers 822 thereon) and a protective overcoating 852 on a bonding surface 850 of the semiconductor layer structure 820. One or more of the elements of the power semiconductor devices 800a, 800b may be similar to corresponding elements of the devices 300a, 300b described with reference to FIGS. 3A and 3B.

The adhesion features 844a, 844b may be selectively provided along the interface 851 between the semiconductor layer structure 820 and the protective overcoating 852 in order to vary or increase adhesion strength at one or more regions of the interface 851, e.g., regions where stress may be concentrated and/or otherwise where delamination may be problematic. As such, the area density of the adhesion features may differ at different regions of the interface 851. In FIG. 8A, the adhesion features 844a are continuously provided along an entirety of the periphery 851p of the interface 851, including at corners 851r and edge regions or edges 851e of the periphery 851p, with central regions free of the adhesion features 844a. In FIG. 8B, the adhesion features 844b are selectively provided along corners 851r of the periphery 851p of the interface 851, with edge regions 851e and central regions free of the adhesion features 844b. In FIGS. 8A and 8B, the area density of the adhesion features 844a, 844b at the periphery 851p of the interface 851 is thus greater than at a central regions of the interface 851. The schematic cross sectional views shown in any of FIGS. 3A-3B to FIGS. 7A-7C may be taken along line AB-A'/B' of FIG. 8A or 8B.

It will be understood that the arrangements of adhesion features shown in FIGS. 8A and 8B are illustrated by way of example only, and that embodiments of the present disclosure are not limited to these particular examples. More generally, embodiments of the present disclosure may include any arrangements and/or combinations of adhesion features that provide a varying adhesion strength along one or more regions of the interface between a semiconductor layer structure and a protective overcoating thereon.

Further embodiments of the present disclosure may include stress-reducing features and/or films, as shown in FIGS. 9A-9B and 10A-10B, alone or in combination with adhesion features as described herein. For example, in addition or as alternative to the adhesion features illustrated above in FIGS. 3A-3B to FIGS. 7A-7C, a stress buffer layer or film (e.g., a silicone-based layer or film) may be provided at one or more regions of the bonding surface. The stress buffer film may be configured to reduce or alleviate stress, for example, during thermal shock or other conditions that may induce thermomechanical stress in a power semiconductor device. However, in overmold-type packages, the stress buffer film may reduce friction or adhesion between the bonding surface and the molding compound (e.g., overmolded plastic or OMP, also referred to herein as an overmold). For example, if the stress buffer film extends along the entire periphery of the semiconductor layer structure, adhesion between the molding compound and the semiconductor layer structure may be insufficient to hold the semiconductor layer structure in place during thermal shock. Under such conditions, stress may be redistributed to or otherwise relieved through the die attach layer (which is typically a softer material, such as solder) between the semiconductor layer structure and the package submount or flange. The increased stress in the die attach layer may induce bonding layer failure (i.e., delamination of the die from the package submount), and may indicate potential parametric (e.g., thermal resistance (Rth)) failure. That is, the reduction of adhesion between the molding compound and the semiconductor layer structure, as provided by the stress buffer film, may result in increased stress in (and in some instances, failure of) the die attach layer.

Figure 9A:
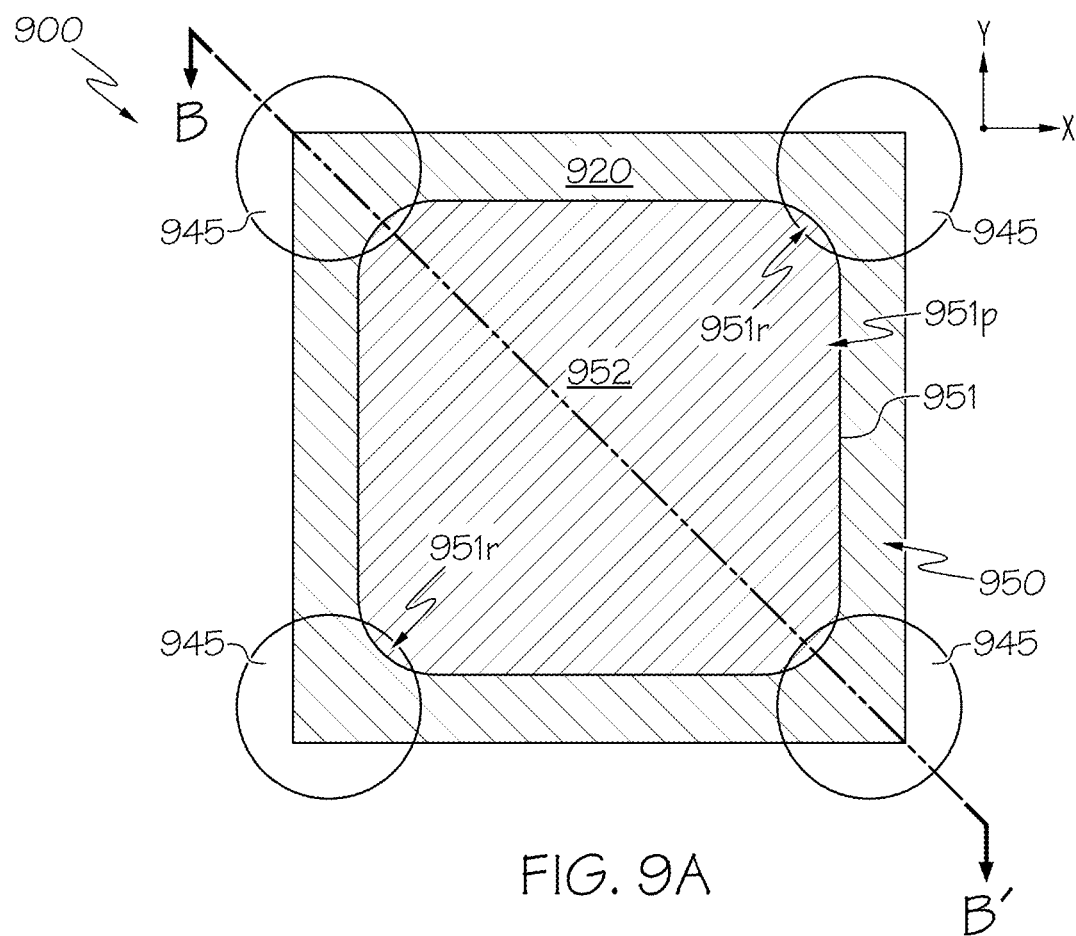
FIG. 9A is a schematic plan view illustrating a power semiconductor device including stress buffer features according to some embodiments of the present disclosure.
Figure 9B:
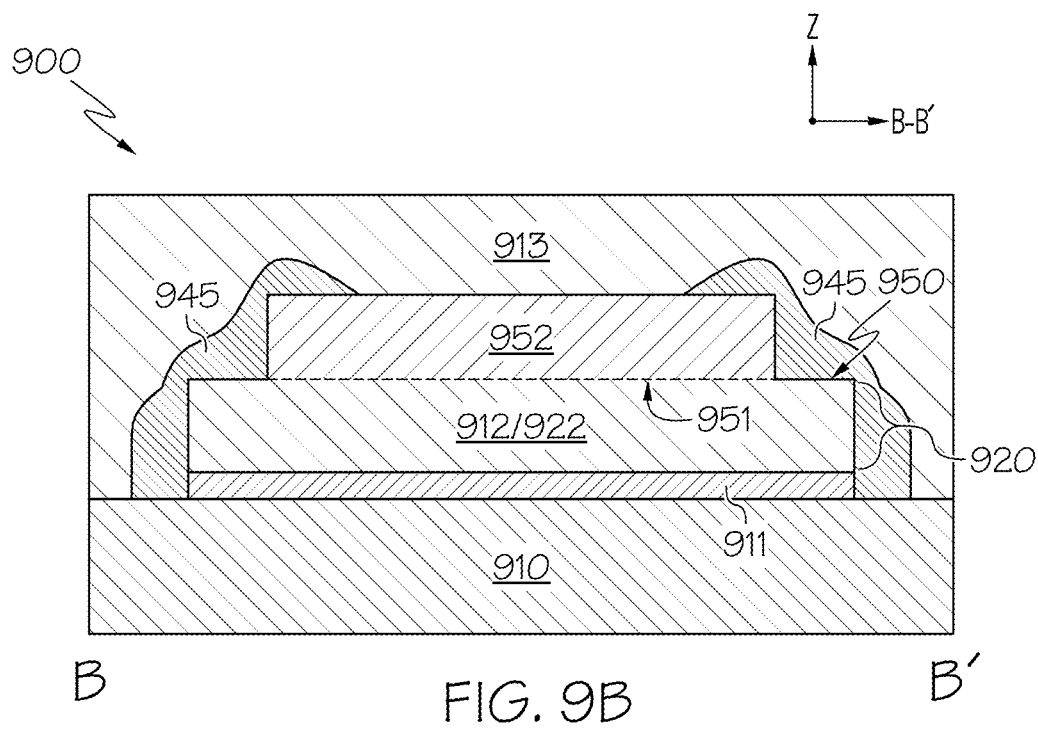
FIG. 9B is a schematic cross-sectional view taken along line B-B' of FIG. 9A.

FIG. 9A is a schematic plan view illustrating a power semiconductor device including stress buffer features according to some embodiments of the present disclosure. FIG. 9B is a schematic cross-sectional view taken along line B-B' of FIG. 9A. In FIG. 9A, the overmold is not shown for ease of illustration. As shown in FIGS. 9A and 9B, a power semiconductor device package 900 includes a semiconductor layer structure 920 (which may include a semiconductor substrate 912 and one or more semiconductor layers 922 thereon) and a protective overcoating 952 on a bonding surface 950 of the semiconductor layer structure 920. The semiconductor layer structure 920 is attached to a package submount or substrate 910 by a die attach layer 911. For example, the package submount 910 may be a conductive (e.g., Cu-based) flange, and the die attach layer 911 may be a solder material AuSn). A molding compound or overmold 913 (e.g., OMP) extends on the submount 910, the bonding surface 950, and the protective overcoating 952. The overmold 913 may encapsulate the semiconductor layer structure 920 and the layer(s) thereon, providing environmental and mechanical protection.

A stress buffer film 945 is provided on the bonding surface 950, adjacent a periphery 951p of one or more regions of an interface 951 between the semiconductor layer structure 920 and the protective overcoating 952. The stress buffer film 945 may be configured to reduce stress along the interface 951 between the bonding surface 950 of the semiconductor layer structure 920 and the protective overcoat 952, but may vary or reduce adhesion between the overmold 913 and the bonding surface 950. For example, the stress buffer film may be a silicone-based gel, which may be selectively deposited (e.g., by selective gel drop) on one or more regions along the interface 951 in some embodiments.

In the example of FIGS. 9A and 9B, the stress buffer film 945 extends on one or more corner regions 951r of the interface 951, while edge regions 951e and central regions of the interface are free of the stress buffer film 945. The stress buffer film 945 may also extend on one or more surfaces of the protective overcoating 952, semiconductor layer structure 920, die attach layer 911, and/or package submount 910. As such, the stress buffer film 945 may be selectively provided adjacent portions 951r of the periphery 951p of the interface 951 so as to reduce stress (e.g., at regions where stress due to CTE mismatch between the materials of the protective overcoat 952 and the semiconductor layer structure 920 may be concentrated), while maintaining adhesion between the semiconductor layer structure 920 and the overmold 913.

Figure 10A:
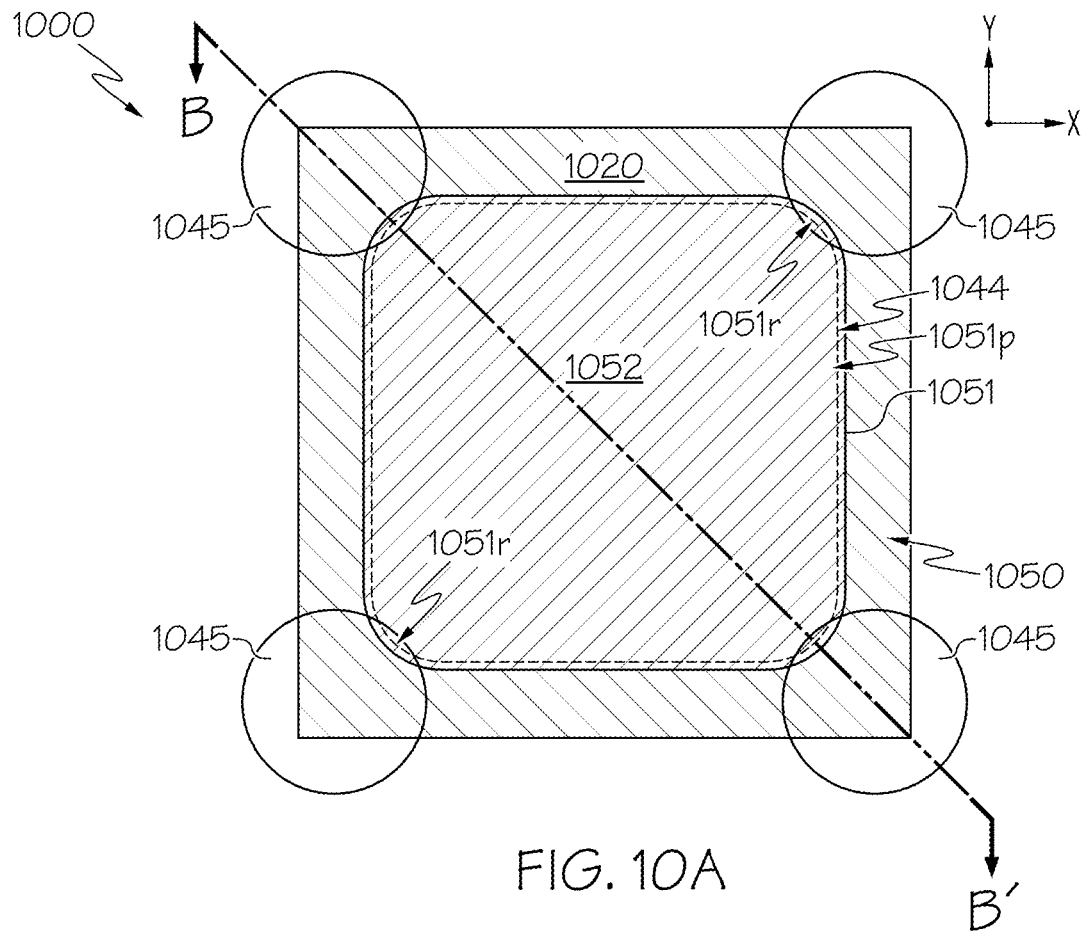
FIG. 10A is a schematic plan view illustrating a power semiconductor device including adhesion features and stress buffer features according to some embodiments of the present disclosure.
Figure 10B:
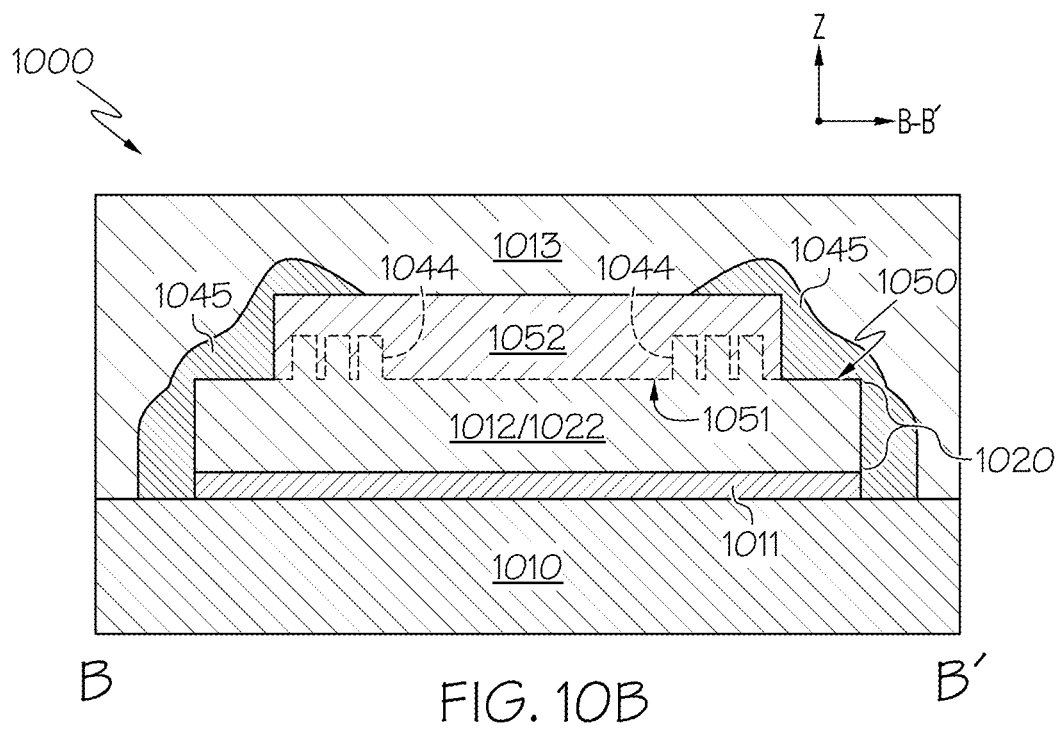
FIG. 10B is a schematic cross-sectional view taken along line B-B' of FIG. 10A.

FIG. 10A is a schematic plan view illustrating a power semiconductor device including adhesion features and stress buffer features according to some embodiments of the present disclosure. FIG. 10B is a schematic cross-sectional view taken along line B-B' of FIG. 10A. In FIG. 10A, the overmold is not shown for ease of illustration. As shown in FIGS. 10A and 10B, a power semiconductor device package 1000 includes a semiconductor layer structure 1020 (which may include a semiconductor substrate 1012 and one or more semiconductor layers 1022 thereon) and a protective overcoating 1052 on a bonding surface 1050 of the semiconductor layer structure 1020. One or more of the elements of the power semiconductor device 1000 may be similar to corresponding elements of the devices 300a, 300b described with reference to FIGS. 3A and 3B.

The example package 1000 of FIGS. 10A and 10B may be similar to the package 900 of FIGS. 9A and 9B, but may further include adhesion features 1044 protruding from and/or recessed in the bonding surface 1050 along one or more regions of a periphery 1051p of an interface 1051 between the semiconductor layer structure 1020 and the protective overcoating 1052. The adhesion features 1044 are configured to vary the adhesion strength between the semiconductor layer structure 1020 and the protective overcoating 1052, and may include any of various adhesion structures (e.g., 344*p/r*, 444*p/r*, 544*p/r*, 644*p/r*, 744*p/r/ra*) or combinations thereof. While illustrated as being provided continuously along an entirety of the periphery 1051*p* of the interface 1051 (similar to the example of FIG. 8A), it will be understood that the adhesion features 1044 may be selectively provided at portions or regions (e.g., at corner regions 1051*r*) of the interface 1051, with other (e.g., central and/or edge) regions of the interface 1051 being free of the adhesion features 1044 (similar to the example of FIG. 8B).

As shown in FIGS. 10A and 10B, the semiconductor layer structure 1020 is attached to a package submount or substrate 1010 (e.g., a conductive flange) by a die attach layer 1011 (e.g., a solder material). A molding compound or overmold 1013 (e.g., OMP) encapsulates or otherwise extends on the submount 1010, the bonding surface 1050, and the protective overcoating 1052 to provide environmental and mechanical protection. A stress buffer film 1045 (e.g., a silicone-based material) is provided (e.g., by selective deposition) on the bonding surface 1050, adjacent the periphery 1051*p* of the interface 1051 between the semiconductor layer structure 1020 and the protective overcoating 1052. The stress buffer film 1045 is configured to reduce stress along the interface 1051 between the bonding surface 1050 of the semiconductor layer structure 1020 and the protective overcoat 1052, and may vary adhesion between the overmold 1013 and the bonding surface 1050.

In the example of FIGS. 10A and 10B, the stress buffer film 1045 is selectively deposited on corner regions 1051*r* of the interface 1051, on or adjacent the adhesion features 1044 protruding from and/or recessed in the bonding surface 1050. That is, the stress buffer film 1045 may be formed on portions of the overcoating 1052 and the bonding surface 1050, and may overlap at least a subset of the adhesion features 1044 in plan view. Edge regions and central regions of the interface 1051 may be free of the stress buffer film 1045. The stress buffer film 1045 may also extend on one or more surfaces of the protective overcoating 1052, semiconductor layer structure 1020, die attach layer 1011, and/or package submount 1010. As such, the stress buffer film 1045 and the adhesion features 1044 may be selectively provided adjacent portions 1051*r* of the periphery 1051*p* of the interface 1051 so as to cooperatively function to reduce stress and increase adhesion, respectively, at one or more regions of the interface 1051 (e.g., at regions where stress due to CTE mismatch between the materials of the protective overcoating 1052 and the semiconductor layer structure 1020 may be concentrated), while maintaining adhesion between the semiconductor layer stricture 1020 and the overmold 1013.

It will be understood that the stress buffer features shown in FIGS. 9A-9B and FIGS. 10A-10B are illustrated by way of example only, and that embodiments of the present disclosure are not limited to these particular examples and may include other configurations and/or positions of stress buffer features that are configured to reduce stress in a protective overcoating while maintaining adhesion between a semiconductor layer structure and a molding compound thereon. In some embodiments, the semiconductor layer structure and/or one or more layers thereon may be shaped or otherwise configured to further reduce stress, particularly in higher-elastic modulus semiconductor die materials, such as SiC, Si, diamond, and/or GaN-based dies. For example, a surface of the semiconductor layer structure and/or one or more layers thereon (e.g., a backside metallization layer) may include rounded or chamfered corners, as described for example in commonly-assigned U.S. patent application Ser. No. 16/421,824 to Joo et al., the disclosure of which is incorporated by reference in its entirety.

More generally, embodiments of the present disclosure are directed to protective layers, stress buffer films, and/or bonding surfaces that are configured to provide greater adhesion and/or reduce stress, particularly at areas or regions of a die that may be more susceptible to delamination and/or other failure. In particular, embodiments described herein may provide bonding surfaces and/or stress buffer films with a spatially varying adhesion strength (e.g., by increasing a contact surface area with a protective overcoating, and/or by maintaining adhesion between the overmold and bonding surface), thereby preventing or reducing the likelihood of delamination.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A power semiconductor device, comprising:
   a semiconductor layer structure; and
   a protective overcoating on a bonding surface of the semiconductor layer structure,
   wherein the bonding surface comprises a plurality of adhesion features that are non-uniformly arranged along a continuous interface with the protective overcoating, and wherein at least a portion of the bonding surface laterally extends beyond the protective overcoating.

2. The power semiconductor device of claim 1, wherein the adhesion features protrude from and/or are recessed in the bonding surface at one or more regions of the continuous interface.

3. The power semiconductor device of claim 2, wherein the adhesion features define an adhesion strength between the bonding surface and the protective overcoating, and wherein the adhesion strength spatially varies along the continuous interface.

4. The power semiconductor device of claim 3, wherein an area density of the adhesion features at a periphery of the continuous interface is greater than at a central region of the continuous interface.

5. The power semiconductor device of claim 4, wherein the periphery of the continuous interface comprises corner regions and edge regions around the central region, wherein the adhesion features are arranged at the corner regions, and wherein the central region and/or the edge regions are free of the adhesion features.

6. The power semiconductor device of claim 4, wherein the power semiconductor device comprises a Schottky junction, and wherein the periphery of the continuous interface comprises an edge termination region of the Schottky junction.

7. The power semiconductor device of claim 4, wherein the power semiconductor device comprises a MOSFET, and wherein the periphery of the continuous interface comprises a periphery of a metallization structure of the MOSFET.

8. The power semiconductor device of claim 2, wherein the bonding surface comprises a non-planar patterned surface including microstructures that define the adhesion features, wherein the microstructures comprise portions of the semiconductor layer structure that protrude from and/or are recessed into the bonding surface in a non-uniform arrangement.

9. The power semiconductor device of claim 2, wherein the adhesion features are rectangular or triangular in cross-section.

10. The power semiconductor device of claim 2, wherein the adhesion features comprise inverted frustum shapes having opposing sidewalls that are inclined or curved towards one another at the continuous interface.

11. The power semiconductor device of claim 1, further comprising:
    a submount including the semiconductor layer structure attached thereto;
    an overmold extending on the submount, the bonding surface, and the protective overcoating thereon; and
    a stress buffer film between the overmold and the bonding surface adjacent a periphery of the continuous interface and configured to vary adhesion between the overmold and bonding surface.

12. A power semiconductor device, comprising:
    a semiconductor layer structure; and
    a protective overcoating on a bonding surface of the semiconductor layer structure,
    wherein the bonding surface comprises an intermediary layer comprising a material that is configured to increase adhesion and/or reduce permeability between the semiconductor layer structure and the protective overcoating, and
    wherein the bonding surface comprises a plurality of adhesion features that are non-uniformly arranged along a continuous interface with the protective overcoating.

13. A power semiconductor device, comprising:
    a semiconductor layer structure; and
    a protective overcoating on a bonding surface of the semiconductor layer structure, wherein an adhesion strength between the bonding surface of the semiconductor layer structure and the protective overcoating at a periphery of a continuous interface therebetween is different than at a central region of the continuous interface.

14. The power semiconductor device of claim 13, wherein the adhesion strength at the periphery of the continuous interface is greater than at the central region of the continuous interface.

15. The power semiconductor device of claim 14, wherein the periphery of the continuous interface comprises corner regions and edge regions, and wherein the adhesion strength at the corner regions is greater than at the edge regions.

16. The power semiconductor device of claim 14, further comprising:
    a submount including the semiconductor layer structure attached thereto;

an overmold extending on the submount, the bonding surface, and the protective overcoating thereon; and a stress buffer film between the overmold and the bonding surface adjacent the periphery of the continuous interface and configured to vary adhesion between the overmold and bonding surface.

17. The power semiconductor device of claim 13, wherein the bonding surface comprises a plurality of adhesion features protruding therefrom and/or recessed therein along one or more regions of the continuous interface.

18. The power semiconductor device of claim 17, wherein the bonding surface comprises a non-planar patterned surface including microstructures that define the adhesion features.

19. The power semiconductor device of claim 17, wherein the adhesion features comprise inverted frustum shapes having opposing sidewalls that are inclined or curved towards one another at the continuous interface.

20. The power semiconductor device of claim 13,
wherein the bonding surface comprises an intermediary layer comprising a material that is configured to increase adhesion and/or reduce permeability between the semiconductor layer structure and the protective overcoating.

21. A power semiconductor device, comprising:
a semiconductor layer structure; and
a protective overcoating on a bonding surface of the semiconductor layer structure,
wherein a continuous interface between the protective overcoating and the bonding surface comprises a non-planar patterned surface, and features of the non-planar patterned surface have different area densities at central and peripheral regions of the continuous interface.

22. The power semiconductor device of claim 21, wherein features of the non-planar patterned surface comprise microstructures protruding from and/or recessed in the bonding surface.

23. The power semiconductor device of claim 22, wherein an area density of the microstructures at the peripheral region is greater than an area density of the microstructures at the central region.

24. The power semiconductor device of claim 23, wherein the peripheral region comprises corner regions and edge regions around the central region, wherein the microstructures are arranged at the corner regions, and wherein the central region and/or the edge regions are free of the microstructures.

25. A power semiconductor device, comprising:
a submount;
a semiconductor layer structure attached to the submount;
a protective overcoating on a bonding surface of the semiconductor layer structure, wherein an interface between the bonding surface and the protective overcoating thereon is opposite the submount;
an overmold extending on the submount, the bonding surface, and the protective overcoating thereon; and
a stress buffer film on the bonding surface laterally adjacent a periphery of the interface and configured to vary adhesion between the overmold and bonding surface, wherein the bonding surface comprises corner regions and edge regions that extend around a central region, wherein the central region and/or the edge regions are free of the stress buffer film thereon.

26. The power semiconductor device of claim 25, wherein the periphery of the interface comprises corner regions and edge regions around a central region, wherein the stress buffer film extends on at least one of the corner regions, and wherein the central region and/or the edge regions are free of the stress buffer film.

27. The power semiconductor device of claim 25, wherein the stress buffer film comprises a silicone coating.

28. The power semiconductor device of claim 25, wherein an adhesion strength between the bonding surface of the semiconductor layer structure and the protective overcoating thereon spatially varies along the interface therebetween.

29. The power semiconductor device of claim 28, wherein the adhesion strength at the periphery of the interface is greater than at a central region of the interface.

30. The power semiconductor device of claim 29, wherein the periphery of the interface comprises corner regions and edge regions, and wherein the adhesion strength at the corner regions is greater than at the edge regions.

31. The power semiconductor device of claim 28, wherein the bonding surface comprises a plurality of adhesion features protruding therefrom and/or recessed therein along one or more regions of the interface.

32. The power semiconductor device of claim 28, wherein the bonding surface comprises an intermediary layer comprising a material that is configured to increase adhesion and/or reduce permeability between the semiconductor layer structure and the protective overcoating.

* * * * *